US012578869B2

(12) United States Patent
Tran et al.

(10) Patent No.: US 12,578,869 B2
(45) Date of Patent: Mar. 17, 2026

(54) REDUNDANCY FOR AN ARRAY OF NON-VOLATILE MEMORY CELLS USING TAG REGISTERS

(71) Applicant: Silicon Storage Technology, Inc., San Jose, CA (US)

(72) Inventors: Hieu Van Tran, San Jose, CA (US); Thuan Vu, San Jose, CA (US); Kha Nguyen, Ho Chi Minh (VN); Stephen Trinh, San Jose, CA (US); Stanley Hong, San Jose, CA (US); Hien Pham, Ho Chi Minh (VN)

(73) Assignee: Silicon Storage Technology, Inc., San Jose, TX (US)

( * ) Notice: Subject to any disclaimer, the term of this patent is extended or adjusted under 35 U.S.C. 154(b) by 256 days.

(21) Appl. No.: 18/134,928

(22) Filed: Apr. 14, 2023

(65) Prior Publication Data

US 2024/0256146 A1      Aug. 1, 2024

Related U.S. Application Data

(60) Provisional application No. 63/442,723, filed on Feb. 1, 2023.

(51) Int. Cl.
*G06F 3/06*          (2006.01)
*G11C 11/54*         (2006.01)
*G11C 29/00*         (2006.01)

(52) U.S. Cl.
CPC .......... *G06F 3/0619* (2013.01); *G06F 3/0659* (2013.01); *G06F 3/0679* (2013.01); *G11C 11/54* (2013.01); *G11C 29/70* (2013.01)

(58) Field of Classification Search
None
See application file for complete search history.

(56) References Cited

U.S. PATENT DOCUMENTS

| | | | | |
|---|---|---|---|---|
| 5,029,130 A | | 7/1991 | Yeh | |
| 5,383,156 A | * | 1/1995 | Komatsu | G11C 29/835 365/225.7 |
| 5,532,966 A | * | 7/1996 | Poteet | G11C 29/785 365/225.7 |
| 6,249,466 B1 | * | 6/2001 | Ramakrishnan | G11C 29/812 365/230.03 |
| 6,407,944 B1 | * | 6/2002 | Choi | G11C 16/107 365/185.11 |

(Continued)

FOREIGN PATENT DOCUMENTS

TW            202141496          11/2021

OTHER PUBLICATIONS

PCT Search Report & Written Opinion mailed on Dec. 14, 2023 corresponding to the related PCT Patent Application No. PCT/US2023/019751.

(Continued)

*Primary Examiner* — Douglas King
(74) *Attorney, Agent, or Firm* — Vedder Price P.C.

(57)          ABSTRACT

Numerous examples are disclosed of systems and methods to implement redundancy. In one example, a system comprises an array of non-volatile memory cells; a redundant array of non-volatile memory cells; and an input block coupled to respective rows in the array and respective rows in the redundant array and comprising row tag registers and redundant row tag registers.

4 Claims, 36 Drawing Sheets

(56)            References Cited

U.S. PATENT DOCUMENTS

| | | | |
|---|---|---|---|
| 6,747,310 | B2 | 6/2004 | Fan |
| 10,748,630 | B2 | 8/2020 | Tran et al. |
| 2002/0039311 | A1* | 4/2002 | Takeuchi ............... G11C 16/20 |
| | | | 365/185.09 |
| 2004/0163015 | A1* | 8/2004 | Nadeau-Dostie ...... G11C 29/44 |
| | | | 714/42 |
| 2004/0190357 | A1* | 9/2004 | Scheuerlein ........... G11C 29/78 |
| | | | 365/222 |
| 2008/0141067 | A1 | 6/2008 | Nautiyal |
| 2010/0064186 | A1* | 3/2010 | Houg ..................... G11C 29/78 |
| | | | 714/711 |
| 2012/0127813 | A1* | 5/2012 | Jeong ................... G11C 29/808 |
| | | | 365/200 |
| 2017/0337466 | A1 | 11/2017 | Bayat et al. |
| 2022/0293173 | A1* | 9/2022 | Hu ....................... G06F 9/30101 |
| 2023/0317198 | A1* | 10/2023 | Park ....................... G11C 29/18 |

OTHER PUBLICATIONS

Taiwanese Patent Office mailed on Nov. 28, 2024 corresponding to the related Taiwanese Patent Application No. 113101486.
PCT Invitation to Pay Additional Fees mailed on Oct. 23, 2023 corresponding to the related PCT Patent Application No. PCT/US2023/019751.
U.S. Appl. No. 18/077,686, filed Dec. 8, 2022 entitled "Input Circuit for Artificial Neural Network Array," Tran, et al.

* cited by examiner

Memory Cell
310

Memory Cell
410

Memory Cell
510

VMM System
2300

VMM System
2410 w+ array
2411 w- array
2412

VMM System
2500

Figure 26:
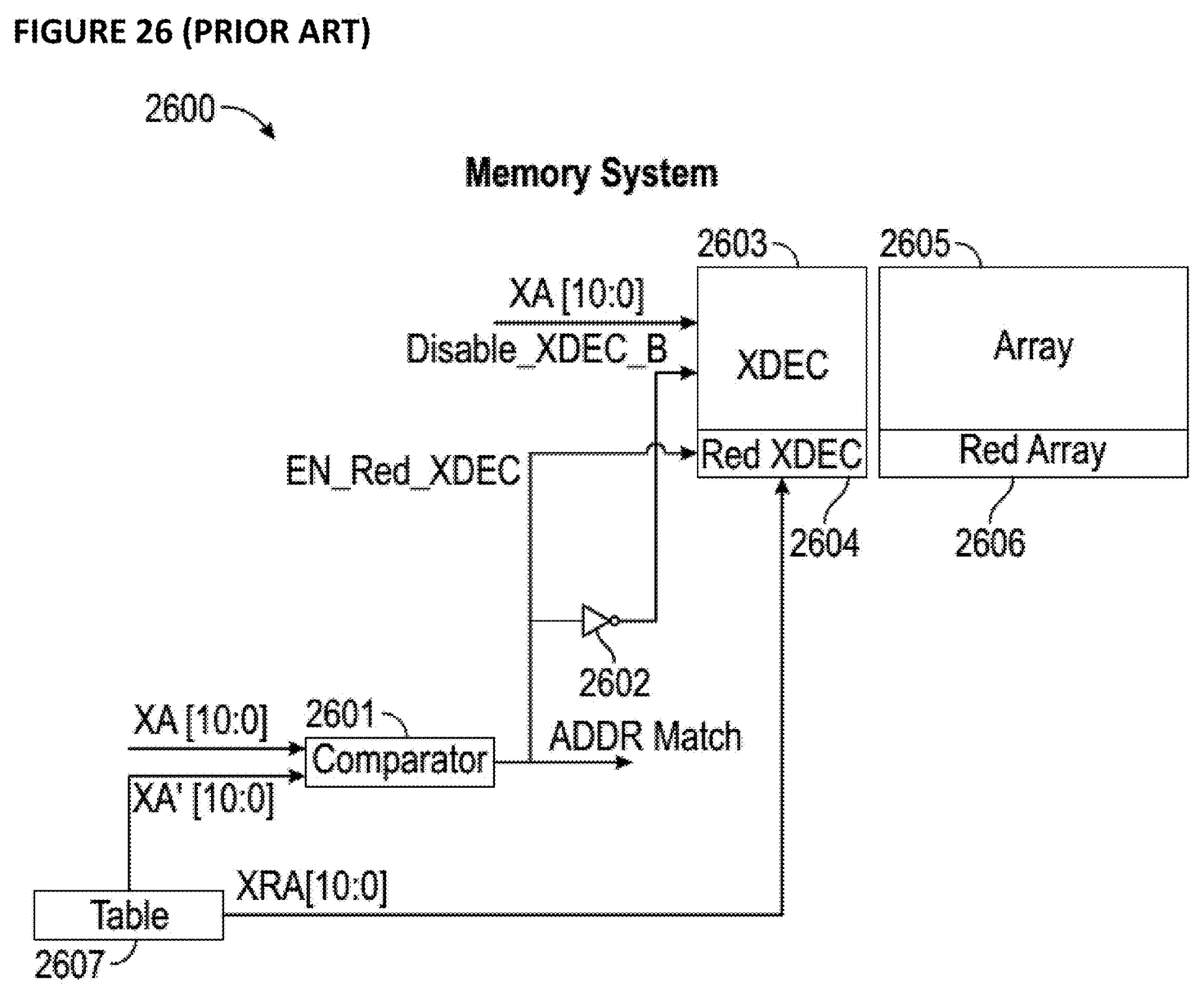

Memory System

2605

Array

2606

Red Array

2603

XDEC

2604

Red XDEC

XA [10:0]

Disable_XDEC_B

EN_Red_XDEC

2602

ADDR Match

2601

Comparator

XA [10:0]

XA' [10:0]

XRA[10:0]

Table

2607

3000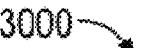
Row Tag Register Loading Circuit
For Loading Tag Bits:
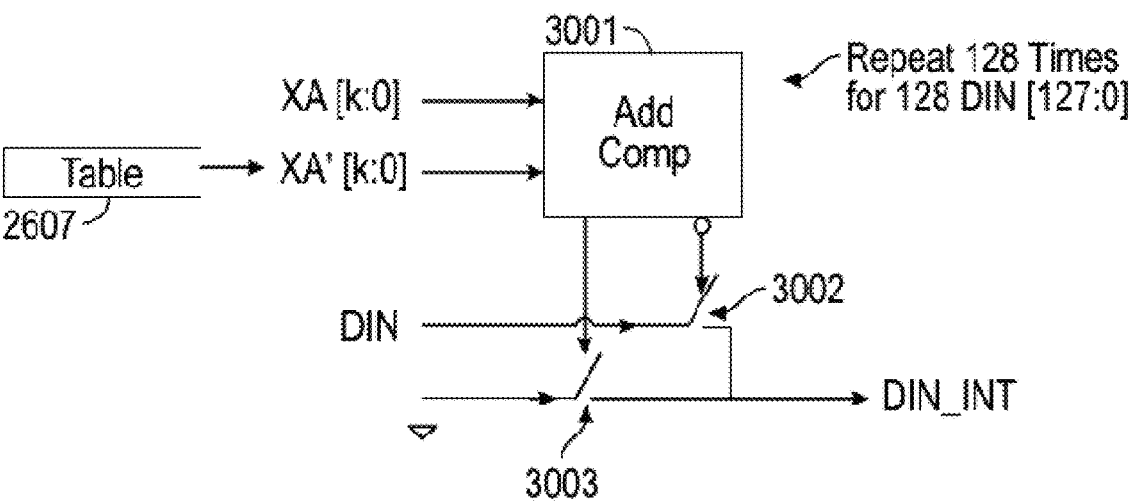
For Loading Redundant Tag Bits:
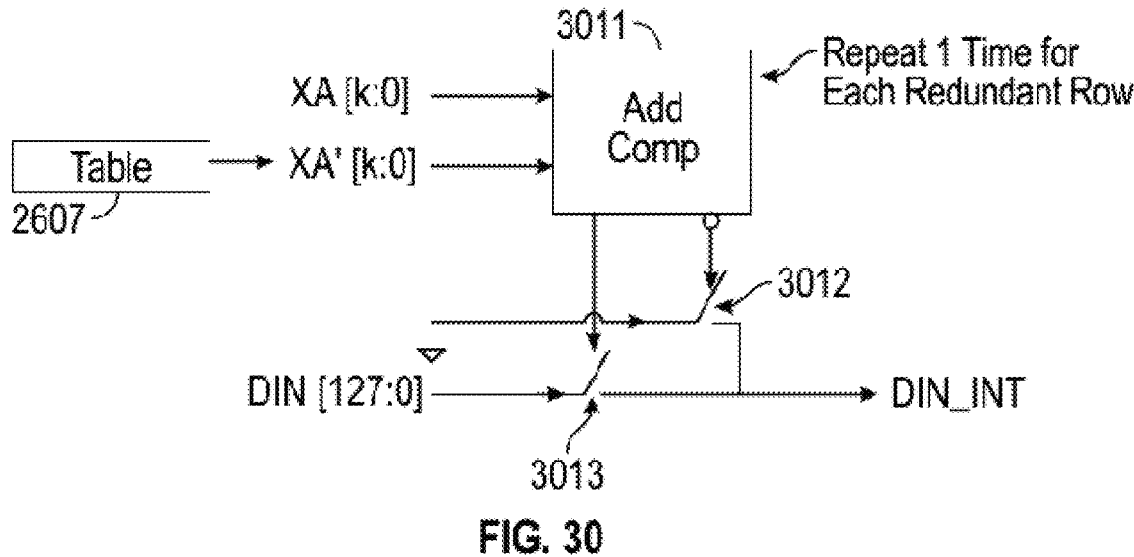
FIG. 30

3100
Row Register Loading Circuit
For Loading Tag Bits:
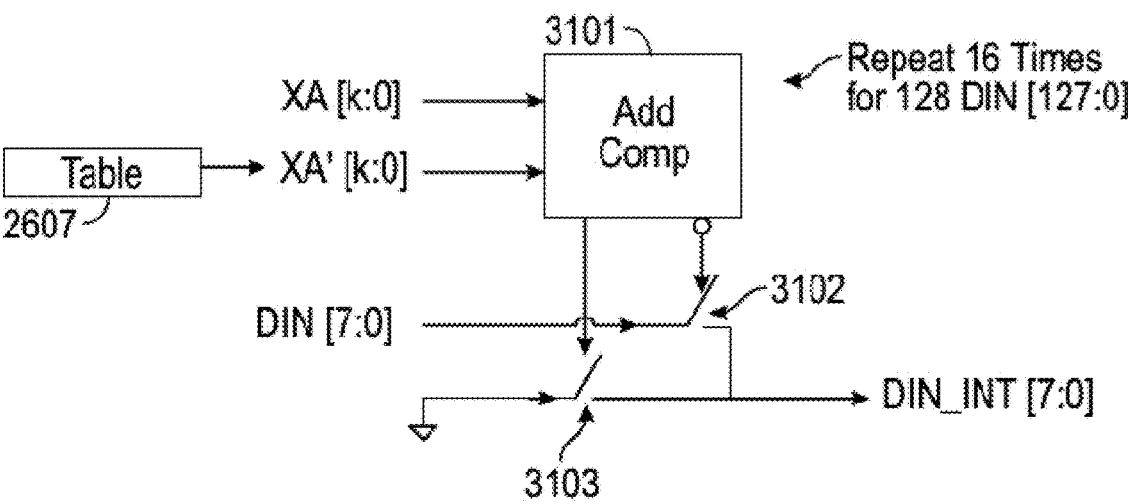
For Loading Redundant Tag Bits:
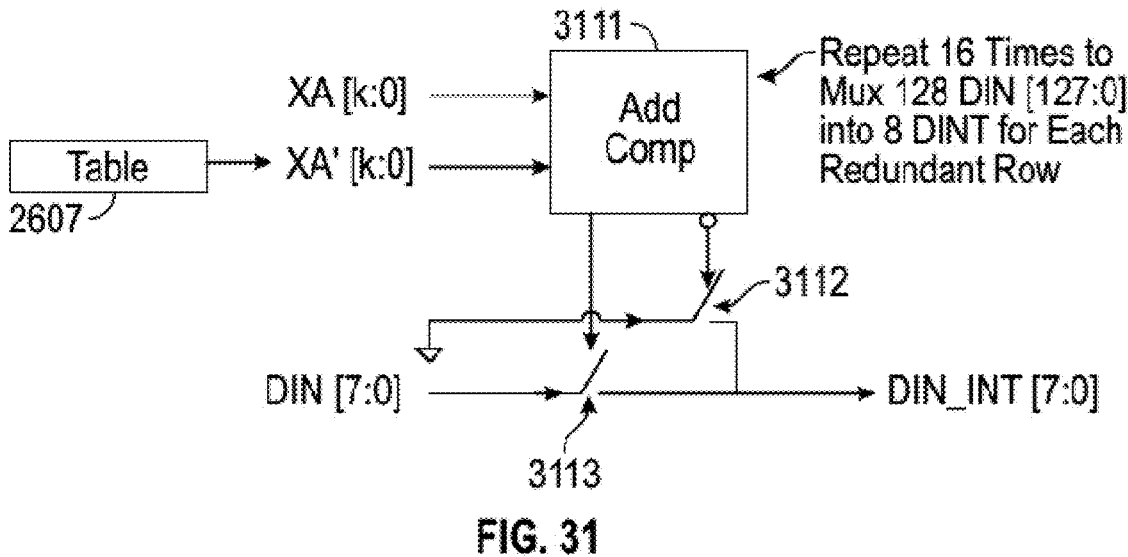
FIG. 31

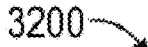

Row Register Load Operation

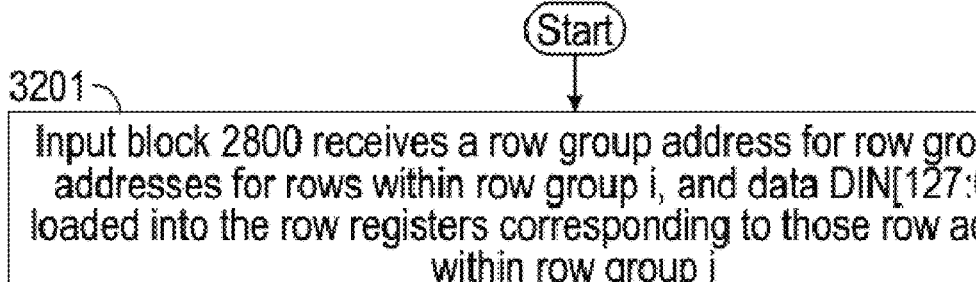

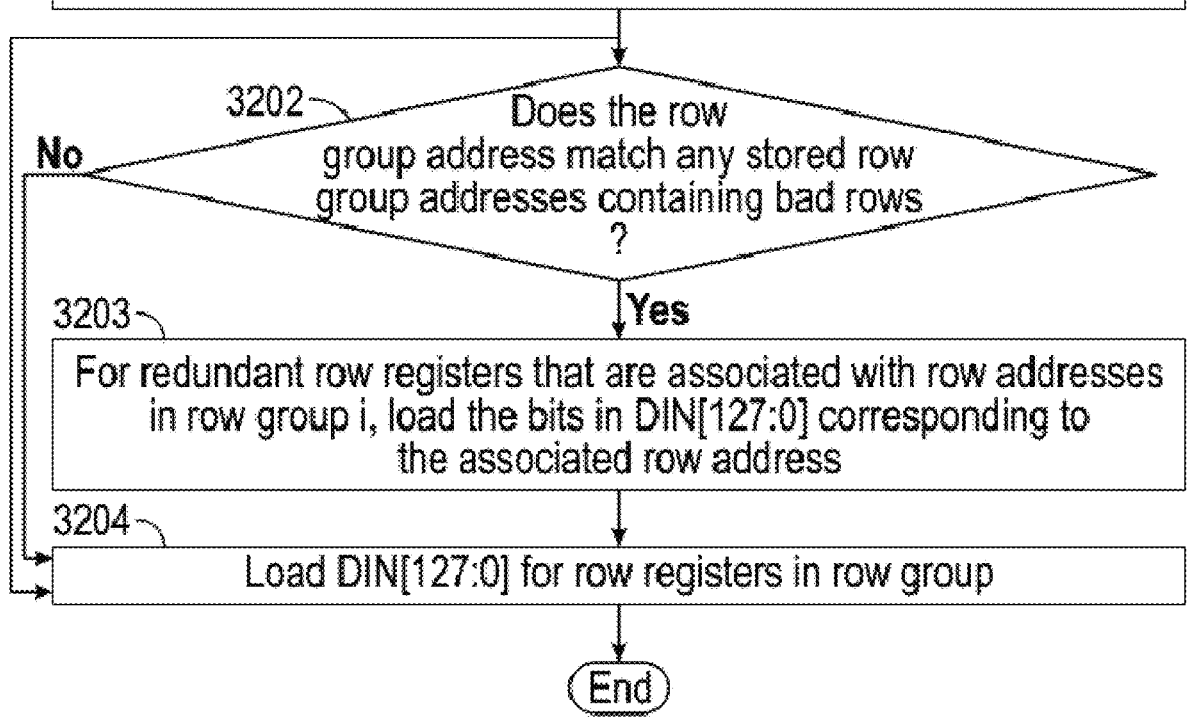

(Start)

3201

Input block 2800 receives a row group address for row group i, row addresses for rows within row group i, and data DIN[127:0] to be loaded into the row registers corresponding to those row addresses within row group i

3202

Does the row group address match any stored row group addresses containing bad rows ?

No

Yes

3203

For redundant row registers that are associated with row addresses in row group i, load the bits in DIN[127:0] corresponding to the associated row address

3204

Load DIN[127:0] for row registers in row group (End)

FIG. 32

3300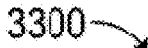

Row Tag Register Load Operation

( Start )

3301

Input block 2800 receives a row group address for row group i, row addresses for rows within row group i, and data DIN[127:0] to be loaded into the row tags corresponding to those row addresses within row group i 3302   No    Does the row group address match any stored row group addresses containing bad rows ?

Yes

3304

For redundant row tag registers that are associated with row addresses in row group i, load the bits in DIN[127:0] corresponding to the associated row address

3305

Load DIN[127:0] for row tag registers in row group i for rows that are not associated with redundant rows. Load "0" into row tag registers for rows that are associated with reduntant rows ( End )

3303

Load DIN[127:0] for row registers in row group i ( End )

Figure 34:
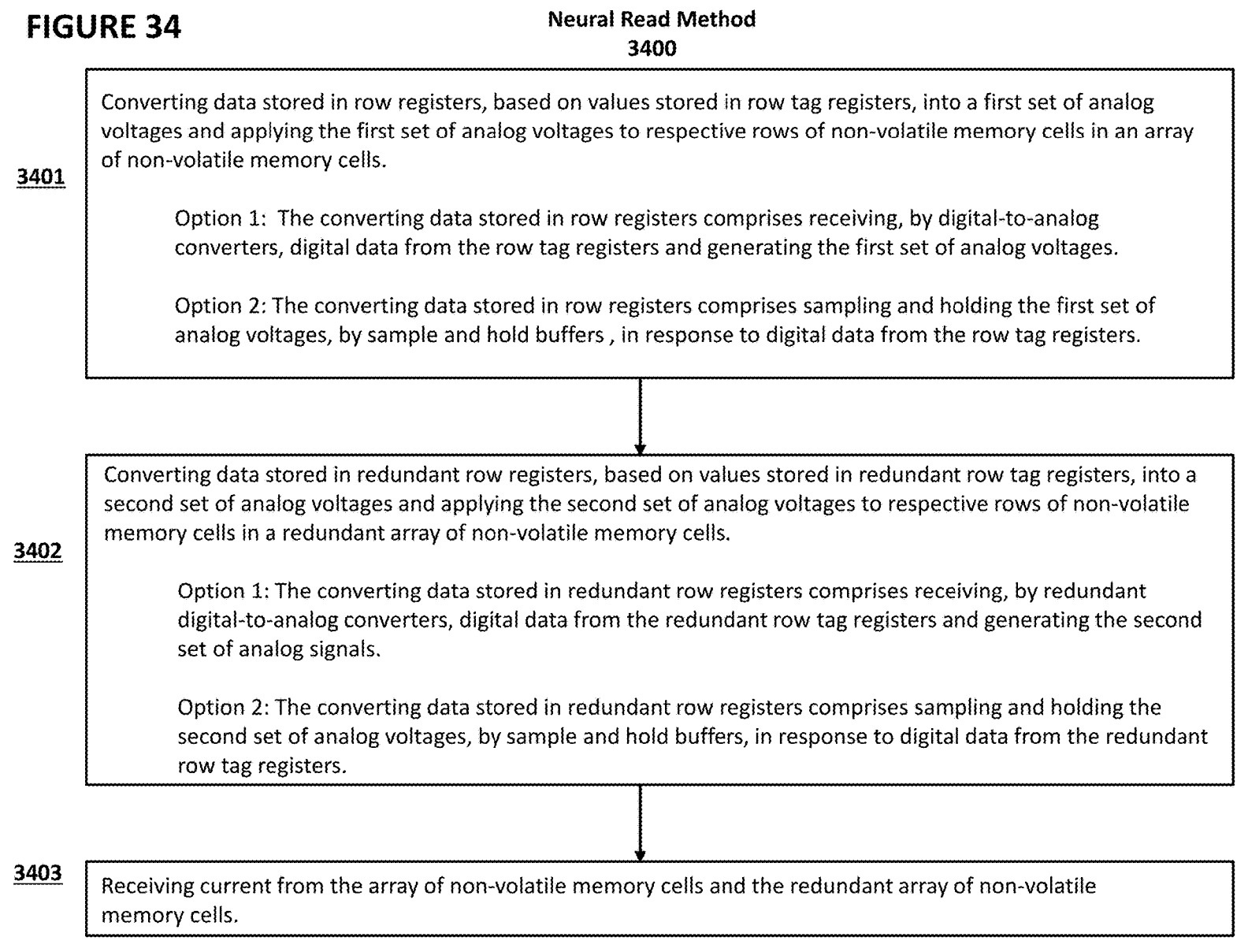

Neural Read Method
3400

3401 Converting data stored in row registers, based on values stored in row tag registers, into a first set of analog voltages and applying the first set of analog voltages to respective rows of non-volatile memory cells in an array of non-volatile memory cells.

Option 1: The converting data stored in row registers comprises receiving, by digital-to-analog converters, digital data from the row tag registers and generating the first set of analog voltages.

Option 2: The converting data stored in row registers comprises sampling and holding the first set of analog voltages, by sample and hold buffers , in response to digital data from the row tag registers.

3402 Converting data stored in redundant row registers, based on values stored in redundant row tag registers, into a second set of analog voltages and applying the second set of analog voltages to respective rows of non-volatile memory cells in a redundant array of non-volatile memory cells.

Option 1: The converting data stored in redundant row registers comprises receiving, by redundant digital-to-analog converters, digital data from the redundant row tag registers and generating the second set of analog signals.

Option 2: The converting data stored in redundant row registers comprises sampling and holding the second set of analog voltages, by sample and hold buffers, in response to digital data from the redundant row tag registers.

3403 Receiving current from the array of non-volatile memory cells and the redundant array of non-volatile memory cells.

Figure 36:
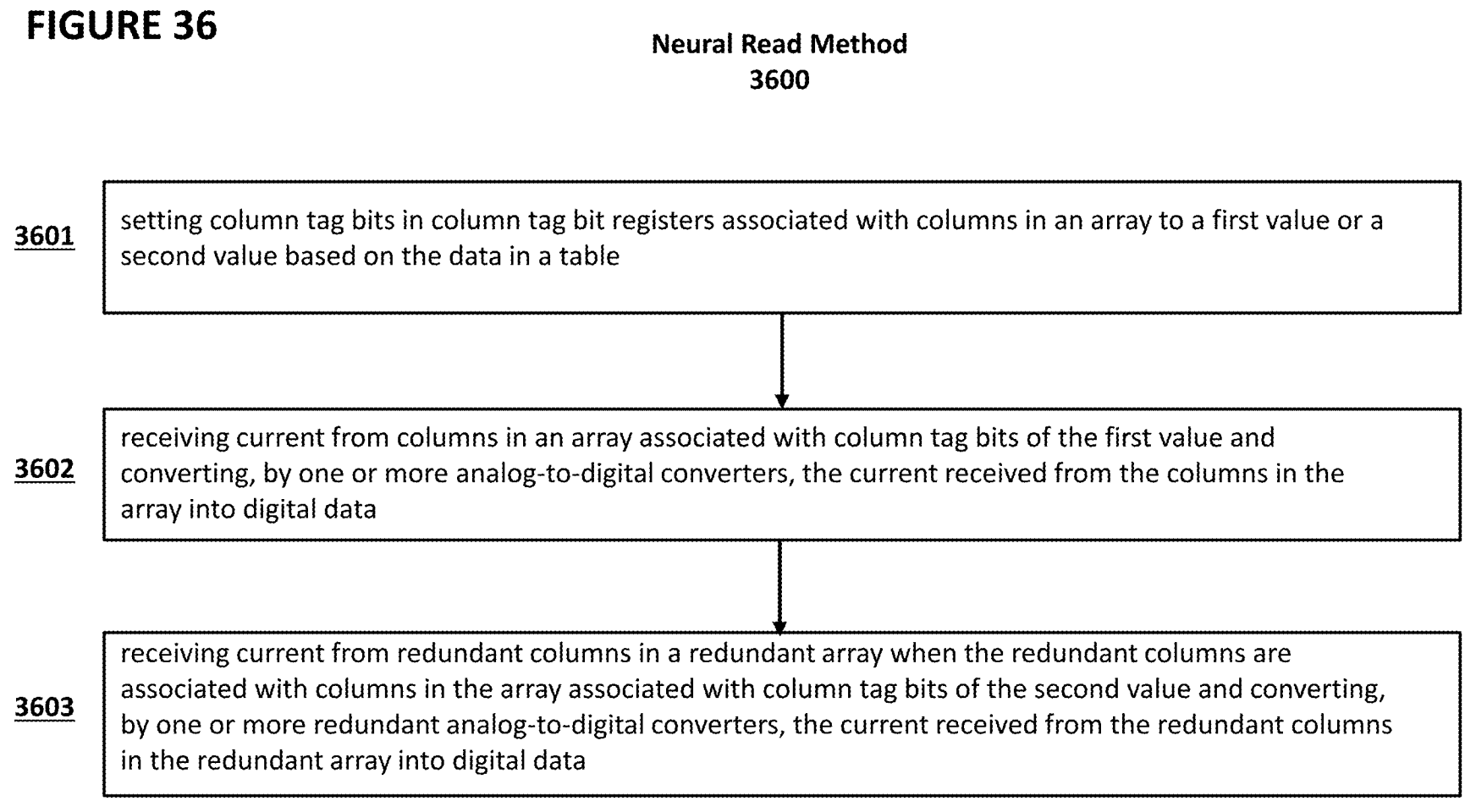

Neural Read Method
3600

3601 setting column tag bits in column tag bit registers associated with columns in an array to a first value or a second value based on the data in a table

3602 receiving current from columns in an array associated with column tag bits of the first value and converting, by one or more analog-to-digital converters, the current received from the columns in the array into digital data

3603 receiving current from redundant columns in a redundant array when the redundant columns are associated with columns in the array associated with column tag bits of the second value and converting, by one or more redundant analog-to-digital converters, the current received from the redundant columns in the redundant array into digital data

REDUNDANCY FOR AN ARRAY OF NON-VOLATILE MEMORY CELLS USING TAG REGISTERS

PRIORITY CLAIM

This application claims priority from U.S. Provisional Patent Application No. 63/442,723, filed on Feb. 1, 2023, and titled "Redundancy for Artificial Neural Network Array," which is incorporated by reference herein.

FIELD OF THE INVENTION

Numerous examples are disclosed of circuitry and methods to implement redundancy for an array of non-volatile memory cells using tag registers.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e., a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. Patent Application Publication 2017/0337466A1, which is incorporated by reference. The non-volatile memory arrays operate as an analog neural memory and comprise non-volatile memory cells arranged in rows and columns. The neural network includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells store a weight value corresponding to a number of electrons on the floating gate. The plurality of memory cells multiply the first plurality of inputs by the stored weight values to generate the first plurality of outputs.

Non-Volatile Memory Cells

Non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim (FN) tunneling.

Memory cell 210 is programmed by source side injection (SSI) with hot electrons (where electrons are placed on the floating gate) by placing a positive voltage on the word line terminal 22, and a positive voltage on the source region 14. Electron current will flow from the drain region 16 towards the source region 14. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e., erased of electrons), then the portion of the channel region 18 under the floating gate 20 is turned on as well, and current will flow across the channel region 18, which is sensed as the erased or "1" state. If the floating gate 20 is negatively charged (i.e., programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage and current ranges that can be applied to the terminals of memory cell 210 for performing read, erase, and program operations:

TABLE NO 1

| Operation of Flash Memory Cell 210 of FIG. 2 | | | |
|---|---|---|---|
| | WL | BL | SL |
| Read | 2-3 V | 0.6-2 V | 0 V |
| Erase | ~11-13 V | 0 V | 0 V |
| Program | 1-2 V | 10.5-3 μA | 9-10 V |

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage and current ranges that can be applied to the terminals of memory cell 310 for performing read, erase, and program operations:

TABLE NO 2

| Operation of Flash Memory Cell 310 of FIG. 3 | | | | |
|---|---|---|---|---|
| | WL/SG | BL | CG | EG | SL |
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 0.1-1 μA | 8-11 V | 4.5-9 V | 4.5-5 V |

Figure 4:
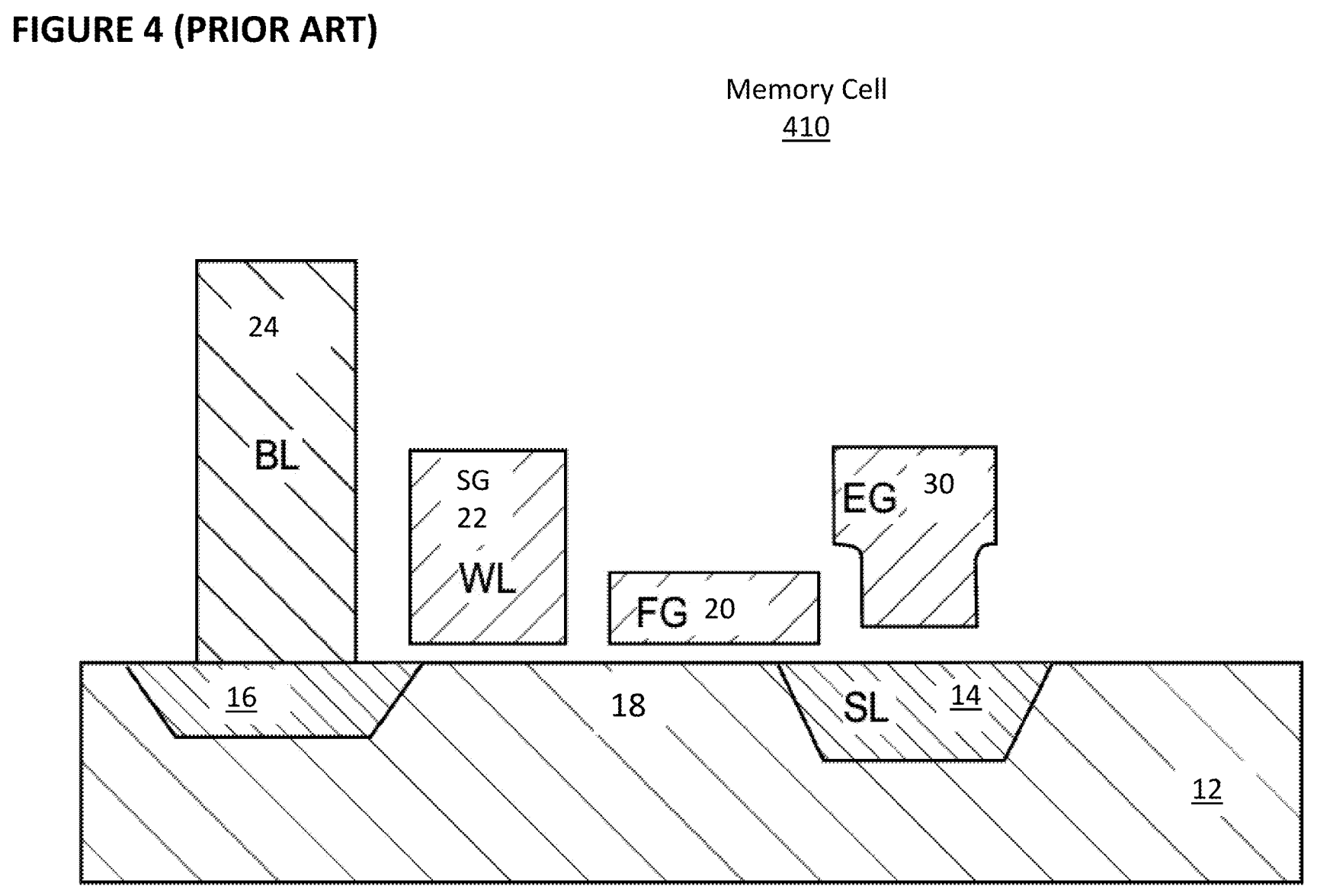

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage is applied on the source line during a program operation to compensate for a lack of control gate bias.

Table No. 3 depicts typical voltage and current ranges that can be applied to the terminals of memory cell 410 for performing read, erase, and program operations:

TABLE NO 3

| Operation of Flash Memory Cell 410 of FIG. 4 | | | |
|---|---|---|---|
| | WL/SG | BL | EG | SL |
| Read | 0.7-2.2 V | 0.6-2 V | 0-2.6 V | 0 V |
| Erase | −0.5 V/0 V | 0 V | 11.5 V | 0 V |
| Program | 1 V | 0.2-3 μA | 4.5 V | 7-9 V |

FIG. 5 depicts stacked gate memory cell 510, which is another type of flash memory cell. Memory cell 510 is similar to memory cell 210 of FIG. 2, except that floating gate 20 extends over the entire channel region 18, and control gate 22 (which here will be coupled to a word line)

extends over floating gate 20, separated by an insulating layer (not shown). The erase is done by FN tunneling of electrons from FG to substrate, programming is by channel hot electron (CHE) injection at region between the channel 18 and the drain region 16, by the electrons flowing from the source region 14 towards to drain region 16 and read operation which is similar to that for memory cell 210 with a higher control gate voltage.

Table No. 4 depicts typical voltage ranges that can be applied to the terminals of memory cell 510 and substrate 12 for performing read, erase, and program operations:

TABLE NO 4

| Operation of Flash Memory Cell 510 of FIG. 5 | | | | |
|---|---|---|---|---|
| | CG | BL | SL | Substrate |
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

The methods and means described herein may apply to other non-volatile memory technologies such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferro-electric ram), CT (charge trap) memory, CN (carbon-tube) memory, OTP (bi-level or multi-level one time programmable), and CeRAM (correlated electron ram), without limitation.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e., charge on the floating gate) of each memory cell in the array can be continuously changed from a fully erased state to a fully programmed state, and vice-versa, independently and with minimal disturbance of other memory cells. This means the cell storage is effectively analog or at the very least can store one of many discrete values (such as 16 or 64 different values), which allows for very precise and individual tuning of all the memory cells in the memory array, and which makes the memory array ideal for storing and making fine tuning adjustments to the synapsis weights of the neural network. Neural Networks Employing Non-Volatile Memory Cell Arrays FIG. 6 conceptually illustrates a non-limiting example of a neural network utilizing a non-volatile memory array of the present examples. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the feature maps of layer C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of layer C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two-dimensional array, and thus in this example layer C1 constitutes 16 layers of two-dimensional arrays (keeping in mind that the layers and arrays referenced herein are logical relationships, not necessarily physical relationships—i.e., the arrays are not necessarily oriented in physical two-dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function P1 is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in layer S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e., every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 7 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed-up output values of differential summer 38 are then supplied to an activation function block 39, which rectifies the output. The activation function block 39 may provide sigmoid, tanh, or ReLU functions. The rectified output values of activation function block 39 become an element of a feature map as the next layer (e.g., C1 in FIG. 6), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summing op-amp 38 and activation function block 39 constitute a plurality of neurons.

The input to VMM array 32 in FIG. 7 (WLx, EGx, CGx, and optionally BLx and SLx) can be analog level, binary level, or digital bits (in which case a DAC is provided to convert digital bits to appropriate input analog level) and the output can be analog level, binary level, or digital bits (in which case an output ADC is provided to convert output analog level into digital bits).

FIG. 8 is a block diagram depicting the usage of numerous layers of VMM arrays 32, here labeled as VMM arrays 32a, 32b, 32c, 32d, and 32e. As shown in FIG. 8, the input, denoted Inputx, is converted from digital to analog by a digital-to-analog converter 31 and provided to input VMM array 32a. The converted analog inputs could be voltage or current. The input D/A conversion for the first layer could be done by using a function or a LUT (look up table) that maps the inputs Inputx to appropriate analog levels for the matrix multiplier of input VMM array 32a. The input conversion could also be done by an analog to analog (A/A) converter to convert an external analog input to a mapped analog input to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 8 contains five layers (32a,32b,32c,32d,32e): one input layer (32a), two hidden layers (32b,32c), and two fully connected layers (32d,32e). One of ordinary skill in the art will appreciate that this is merely an example and that a system instead could comprise more than two hidden layers and more than two fully connected layers.

Vector-by-Matrix Multiplication (VMM) Arrays

FIG. 9 depicts neuron VMM array 900, which is particularly suited for memory cells 310 as shown in FIG. 3 and is utilized as the synapses and parts of neurons between an input layer and the next layer. VMM array 900 comprises memory array 901 of non-volatile memory cells and reference array 902 (at the top of the array) of non-volatile reference memory cells. Alternatively, another reference array can be placed at the bottom.

In VMM array 900, control gate lines, such as control gate line 903, run in a vertical direction (hence reference array 902 in the row direction is orthogonal to control gate line 903), and erase gate lines, such as erase gate line 904, run in a horizontal direction. Here, the inputs to VMM array 900 are provided on the control gate lines (CG0, CG1, CG2, CG3), and the output of VMM array 900 emerges on the source lines (SL0, SL1). In one example, only even rows are used, and in another example, only odd rows are used. The current placed on each source line (SL0, SL1, respectively) performs a summing function of all the currents from the memory cells connected to that particular source line.

As described herein for neural networks, the non-volatile memory cells of VMM array 900, i.e., the memory cells 310 of VMM array 900, may be configured to operate in a sub-threshold region.

The non-volatile reference memory cells and the non-volatile memory cells described herein are biased in weak inversion (sub threshold region):

$$Ids = Io * e^{(Vg-Vth)/nVt} = w * Io * e^{(Vg)/nVt},$$

$$\text{where } w = e^{(-Vth)/nVt}$$

where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current into an input voltage:

$$Vg = n * Vt * \log[Ids/wp * Io]$$

where, wp is w of a reference or peripheral memory cell.

For a memory array used as a vector matrix multiplier VMM array with the current input, the output current is:

$$Iout = wa * Io * e^{(Vg)/nVt}, \text{ namely}$$

$$Iout = (wa/wp) * Iin = W * Iin$$

$$W = e^{(Vthp-Vtha)/nVt}$$

Here, wa=w of each memory cell in the memory array.

Vthp is effective threshold voltage of the peripheral memory cell and Vtha is effective threshold voltage of the main (data) memory cell. Note that the threshold voltage of a transistor is a function of substrate body bias voltage and the substrate body bias voltage, denoted Vsb, can be modulated to compensate for various conditions, on such temperature. The threshold voltage Vth can be expressed as:

$$Vth = Vth0 + gamma(SQRT | Vsb - 2 * \varphi F) - SQRT|2 * \varphi F|)$$

where Vth0 is threshold voltage with zero substrate bias, φF is a surface potential, and gamma is a body effect parameter.

A wordline or control gate can be used as the input for the memory cell for the input voltage.

Alternatively, the flash memory cells of VMM arrays described herein can be configured to operate in the linear region:

$$Ids = beta * (Vgs - Vth) * Vds; beta = u * Cox * Wt/L$$

$$W = \alpha(Vgs - Vth)$$

meaning weight W in the linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region can be used to linearly convert an input/output current into an input/output voltage.

Alternatively, the memory cells of VMM arrays described herein can be configured to operate in the saturation region:

$$Ids = 1/2 * \text{beta} * (Vgs - Vth)^2; \text{beta} = u * Cox * Wt/L$$

$W\alpha(Vgs - Vth)^2$, meaning weight $W$ is proportional to $(Vgs - Vth)^2$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

Other examples for VMM array 32 of FIG. 7 are described in U.S. Pat. No. 10,748,630, which is incorporated by reference herein. As described in that application. a source-line or a bitline can be used as the neuron output (current summation output).

FIG. 10 depicts neuron VMM array 1000, which is particularly suited for memory cells 210 as shown in FIG. 2 and is utilized as the synapses between an input layer and the next layer. VMM array 1000 comprises a memory array 1003 of non-volatile memory cells, reference array 1001 of first non-volatile reference memory cells, and reference array 1002 of second non-volatile reference memory cells. Reference arrays 1001 and 1002, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1014 (only partially depicted) with current inputs flowing into them. The reference cells are tuned (e.g., programmed) to target reference levels. The target reference levels are provided by a reference mini-array matrix (not shown).

Memory array 1003 serves two purposes. First, it stores the weights that will be used by the VMM array 1000 on respective memory cells thereof. Second, memory array 1003 effectively multiplies the inputs (i.e. current inputs provided in terminals BLR0, BLR1, BLR2, and BLR3, which reference arrays 1001 and 1002 convert into the input voltages to supply to wordlines WL0, WL1, WL2, and WL3) by the weights stored in the memory array 1003 and then adds all the results (memory cell currents) to produce the output on the respective bit lines (BL0-BLN), which will be the input to the next layer or input to the final layer. By performing the multiplication and addition function, memory array 1003 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages and currents for VMM array 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 5

| Operation of VMM Array 1000 of FIG. 10: | | | | | | |
|---|---|---|---|---|---|---|
| | WL | WL -unsel | BL | BL -unsel | SL | SL -unsel |
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

FIG. 11 depicts neuron VMM array 1100, which is particularly suited for memory cells 210 as shown in FIG. 2 and is utilized as the synapses and parts of neurons between an input layer and the next layer. VMM array 1100 comprises a memory array 1103 of non-volatile memory cells, reference array 1101 of first non-volatile reference memory cells, and reference array 1102 of second non-volatile reference memory cells. Reference arrays 1101 and 1102 run in row direction of the VMM array 1100. VMM array is similar to VMM 1000 except that in VMM array 1100, the word lines run in the vertical direction. Here, the inputs are provided on the word lines (WLA0, WLBO, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages and currents for VMM array 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 6

| | | | | Operation of VMM Array 1100 of FIG. 11 | | |
|---|---|---|---|---|---|---|
| | WL | WL -unsel | BL | BL -unsel | SL | SL -unsel |
| Read | 1-3.5 V | −0.5 V/0 V | 0.6-2 V | 0.6 V-2 V/0 V | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

FIG. 12 depicts neuron VMM array 1200, which is particularly suited for memory cells 310 as shown in FIG. 3 and is utilized as the synapses and parts of neurons between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1212 (only partially shown) with current inputs flowing into them through BLR0, BLR1, BLR2, and BLR3. Multiplexors 1212 each include a respective multiplexor 1205 and a cascoding transistor 1204 to ensure a constant voltage on the bitline (such as BLR0) of each of the first and second non-volatile reference memory cells during a read operation. The reference cells are tuned to target reference levels.

Memory array 1203 serves two purposes. First, it stores the weights that will be used by the VMM array 1200. Second, memory array 1203 effectively multiplies the inputs (current inputs provided to terminals BLR0, BLR1, BLR2, and BLR3, for which reference arrays 1201 and 1202 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bit lines (BL0-BLN) during a read operation. The current placed on each bitline performs a summing function of all the currents from the memory cells connected to that particular bitline.

VMM array 1200 implements uni-directional tuning for non-volatile memory cells in memory array 1203. That is, each non-volatile memory cell is erased and then partially programmed until the desired charge on the floating gate is reached. If too much charge is placed on the floating gate (such that the wrong value is stored in the cell), the cell is erased and the sequence of partial programming operations starts over. As shown, two rows sharing the same erase gate (such as EG0 or EG1) are erased together (which is known as a page erase), and thereafter, each cell is partially programmed until the desired charge on the floating gate is reached.

Table No. 7 depicts operating voltages and currents for VMM array 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 7

| | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 1.0-2 V | −0.5 V/ 0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Operation of VMM Array 1200 of FIG. 12

FIG. 13 depicts neuron VMM array 1300, which is particularly suited for memory cells 310 as shown in FIG. 3, and is utilized as the synapses and parts of neurons between an input layer and the next layer. VMM array 1300 comprises a memory array 1303 of non-volatile memory cells, reference array 1301 or first non-volatile reference memory cells, and reference array 1302 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1300 is similar to VMM array 1400, except that VMM array 1300 implements bi-directional tuning, where each individual cell can be completely erased, partially programmed, and partially erased as needed to reach the desired amount of charge on the floating gate due to the use of separate EG lines. As shown, reference arrays 1301 and 1302 convert input current in the terminal BLR0, BLR1, BLR2, and BLR3 into control gate voltages CG0, CG1, CG2, and CG3 (through the action of diode-connected reference cells through multiplexors 1314) to be applied to the memory cells in the row direction. The current output (neuron) is in the bit lines BL0-BLN, where each bit line sums all currents from the non-volatile memory cells connected to that particular bitline.

Table No. 8 depicts operating voltages and currents for VMM array 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 8

| | WL | WL - unsel | BL | BL - unsel | CG | CG - unsel same sector | CG - unsel | EG | EG - unsel | SL | SL - unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Operation of VMM Array 1300 of FIG. 13

FIG. 14 depicts neuron VMM array 1400, which is particularly suited for memory cells 210 as shown in FIG. 2 and is utilized as the synapses and parts of neurons between an input layer and the next layer. In VMM array 1400, the inputs $INPUT_0$ . . . , $INPUT_N$ are received on bit lines $BL_0$, . . . $BL_N$, respectively, and the outputs $OUTPUT_1$, $OUTPUT_2$, $OUTPUT_3$, and $OUTPUT_4$ are generated on source lines $SL_0$, $SL_1$, $SL_2$, and $SL_3$, respectively.

Figure 15:
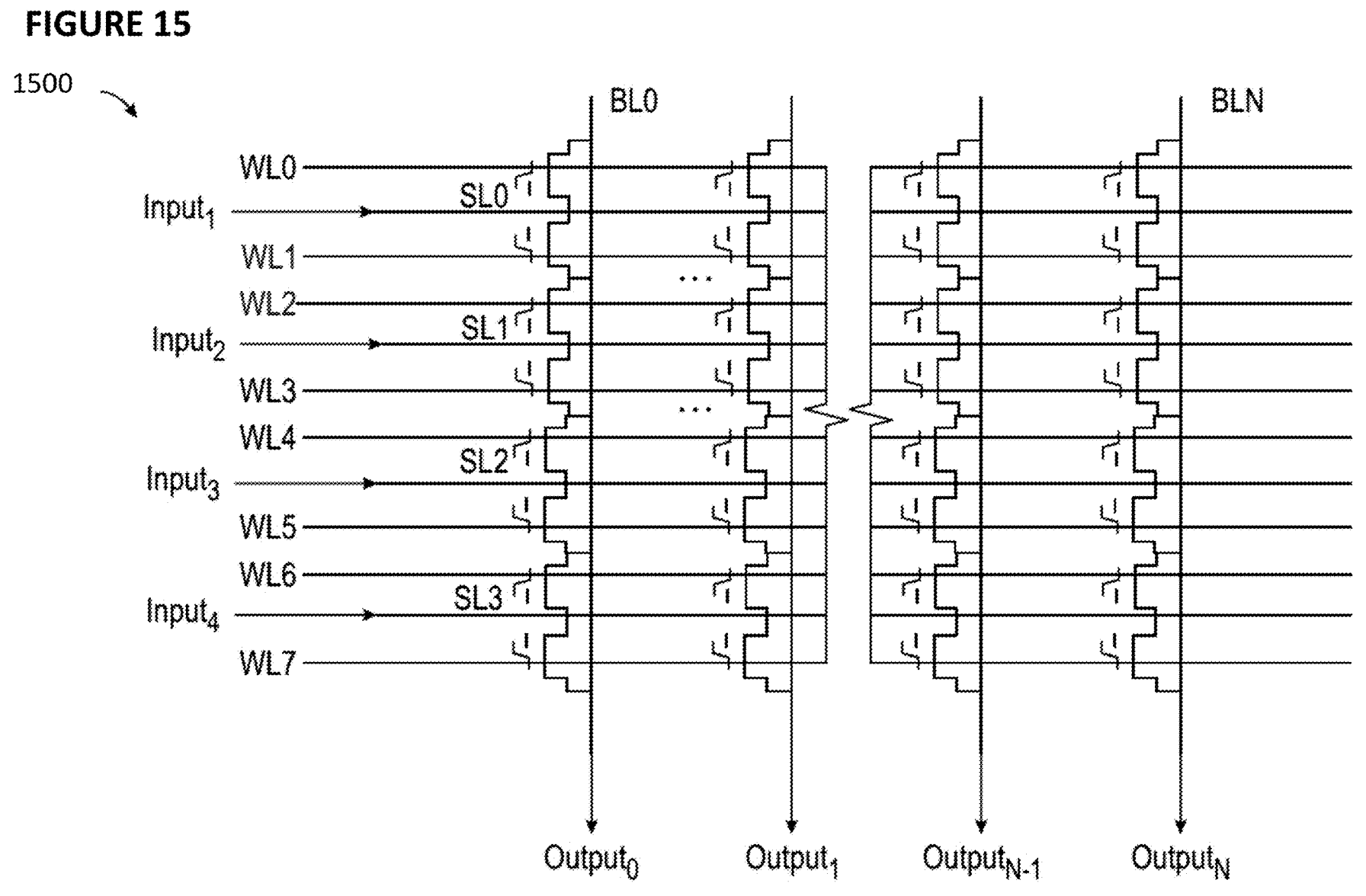

FIG. 15 depicts neuron VMM array 1500, which is particularly suited for memory cells 210 as shown in FIG. 2 and is utilized as the synapses and parts of neurons between an input layer and the next layer. In this example, the inputs $INPUT_0$, $INPUT_1$, $INPUT_2$, and $INPUT_3$ are received on source lines $SL_0$, $SL_1$, $SL_2$, and $SL_3$, respectively, and the outputs $OUTPUT_0$, . . . $OUTPUT_N$ are generated on bit lines $BL_0$, . . . , $BL_N$.

Figure 16:
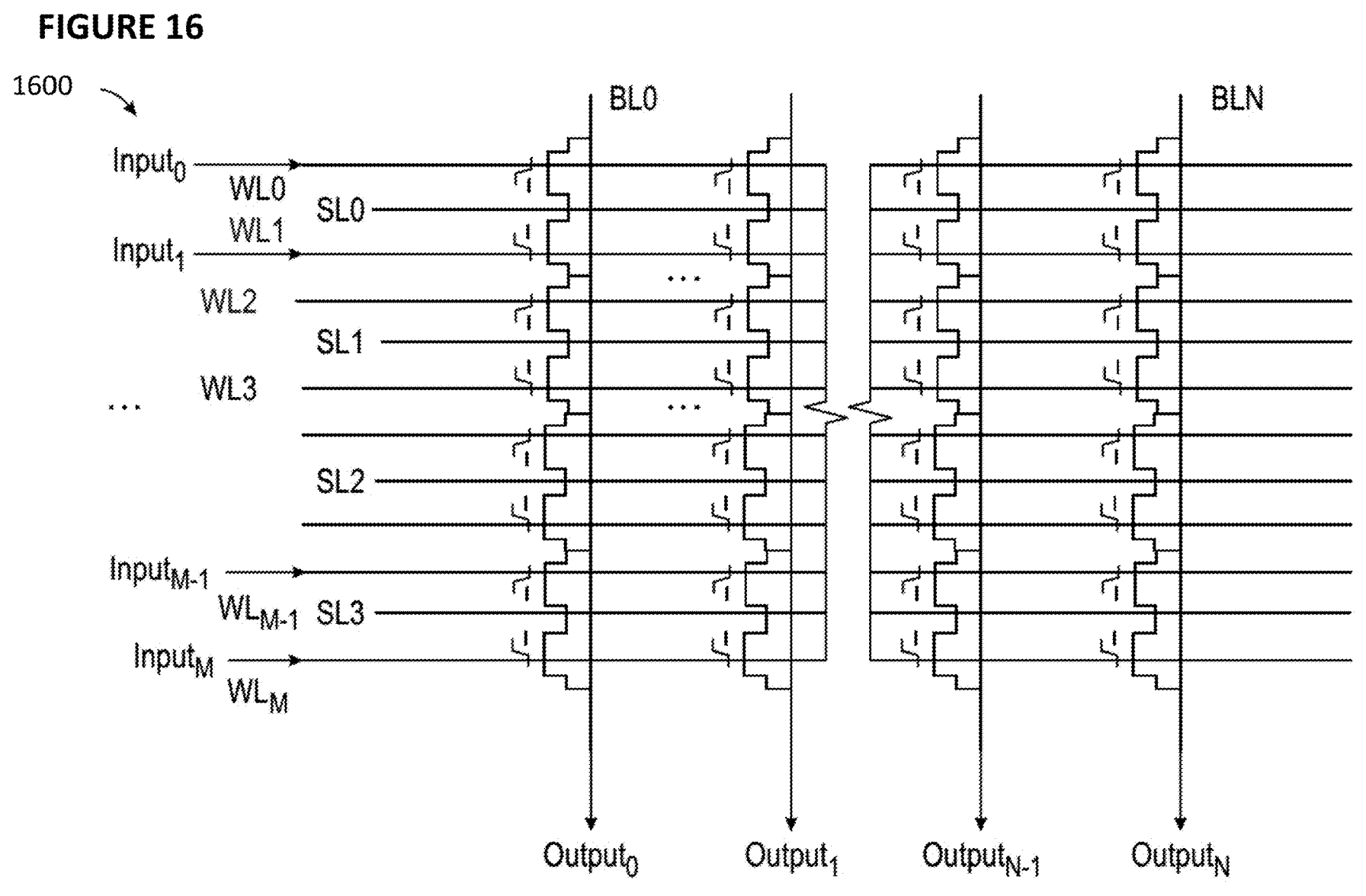

FIG. 16 depicts neuron VMM array 1600, which is particularly suited for memory cells 210 as shown in FIG. 2, and is utilized as the synapses and parts of neurons between an input layer and the next layer. In this example, the inputs $INPUT_0$, . . . , $INPUT_M$ are received on word lines $WL_0$, . . . , $WL_M$, respectively, and the outputs $OUTPUT_0$, . . . $OUTPUT_N$ are generated on bit lines $BL_0$, . . . , $BL_N$.

FIG. 17 depicts neuron VMM array 1700, which is particularly suited for memory cells 310 as shown in FIG. 3, and is utilized as the synapses and parts of neurons between an input layer and the next layer. In this example, the inputs $INPUT_0$, . . . , $INPUT_M$ are received on word lines $WL_0$, . . . , $WL_M$, respectively, and the outputs $OUTPUT_0$, . . . $OUTPUT_N$ are generated on bit lines $BL_0$, . . . , $BL_N$.

FIG. 18 depicts neuron VMM array 1800, which is particularly suited for memory cells 410 as shown in FIG. 4, and is utilized as the synapses and parts of neurons between an input layer and the next layer. In this example, the inputs $INPUT_0$, . . . , $INPUT_n$ are received on vertical control gate lines $CG_0$, . . . , $CG_N$, respectively, and the outputs $OUTPUT_1$ and $OUTPUT_2$ are generated on source lines $SL_0$ and $SL_1$.

FIG. 19 depicts neuron VMM array 1900, which is particularly suited for memory cells 410 as shown in FIG. 4 and is utilized as the synapses and parts of neurons between an input layer and the next layer. In this example, the inputs $INPUT_0$, . . . , $INPUT_N$ are received on the gates of bit line control gates 1901-1, 1901-2, . . . , 1901-(N-1), and 1901-N, respectively, which are coupled to bit lines $BL_0$, . . . , $BL_N$, respectively. Example outputs $OUTPUT_1$ and $OUTPUT_2$ are generated on source lines $SL_0$ and $SL_1$.

FIG. 20 depicts neuron VMM array 2000, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, . . . , $INPUT_M$ are received on word lines $WL_0$, . . . , $WL_M$, and the outputs $OUTPUT_0$, . . . , $OUTPUT_N$ are generated on bit lines $BL_0$, . . . , $BL_N$, respectively.

FIG. 21 depicts neuron VMM array 2100, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, . . . , $INPUT_M$ are received on control gate lines $CG_0$, . . . , $CG_M$. Outputs $OUTPUT_0$, . . . , $OUTPUT_N$ are generated on vertical source lines $SL_0$, . . . , $SL_N$, respectively, where each source line $SL_i$ is coupled to the source lines of all memory cells in column i.

FIG. 22 depicts neuron VMM array 2200, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0$, . . . , $INPUT_M$ are received on control gate lines $CG_0$, . . . , $CG_M$. Outputs $OUTPUT_0$, . . . , $OUTPUT_N$ are generated on vertical bit lines $BL_0$, . . . , $BL_N$, respectively, where each bit line $BL_i$ is coupled to the bit lines of all memory cells in column i.

The input to the VMM arrays can be an analog level, a binary level, a pulse, a time modulated pulse, or digital bits (in this case a DAC is needed to convert digital bits to appropriate input analog level) and the output can be an analog level, a binary level, a timing pulse, pulses, or digital bits (in this case an output ADC is needed to convert output analog level into digital bits).

In general, for each memory cell in a VMM array, each weight W can be implemented by a single memory cell or by a differential cell or by two blend memory cells (average of 2 cells). In the differential cell case, two memory cells are needed to implement a weight W as a differential weight (W=W+−W−). In the two blend memory cells, two memory cells are needed to implement a weight W as an average of two cells.

FIG. 23 depicts VMM system 2300. In some examples, the weights, W, stored in a VMM array are stored as differential pairs, W+ (positive weight) and W− (negative weight), where W=(W+)−(W−). In VMM system 2300, half of the bit lines are designated as W+ lines, that is, bit lines connecting to memory cells that will store positive weights W+, and the other half of the bit lines are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 2301 and 2302. The output of a W+ line and the output of a W− line are combined together to give effectively W=W+−W− for each pair of (W+, W−) cells for all pairs of (W+, W−) lines. While the above has been described in relation to W− lines interspersed among the W+ lines in an alternating fashion, in other examples W+ lines and W− lines can be arbitrarily located anywhere in the array.

FIG. 24 depicts another example. In VMM system 2410, positive weights W+ are implemented in first array 2411 and negative weights W− are implemented in a second array 2412, second array 2412 separate from the first array, and the resulting weights are appropriately combined together by summation circuits 2413.

FIG. 25 depicts VMM system 2500. the weights, W, stored in a VMM array are stored as differential pairs, W+ (positive weight) and W− (negative weight), where W=(W+)−(W−). VMM system 2500 comprises array 2501 and array 2502. Half of the bit lines in each of array 2501 and 2502 are designated as W+ lines, that is, bit lines connecting to memory cells that will store positive weights W+, and the other half of the bit lines in each of array 2501 and 2502 are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 2503, 2504, 2505, and 2506. The output of a W+ line and the output of a W− line from each array 2501, 2502 are respectively combined together to give effectively W=W+−W− for each pair of (W+, W−) cells for all pairs of (W+, W−) lines. In addition, the W values from each array 2501 and 2502 can be further combined through summation circuits 2507 and 2508, such that each W value is the result of a W value from array 2501 minus a W value from array 2502, meaning that the end result from summation circuits 2507 and 2508 is a differential value of two differential values.

Each non-volatile memory cells used in the analog neural memory system is to be erased and programmed to hold a very specific and precise amount of charge, i.e., the number of electrons, in the floating gate. For example, each floating gate should hold one of N different values, where N is the number of different weights that can be indicated by each cell. Examples of N include 16, 32, 64, 128, and 256.

Prior art non-volatile memory systems outside of the VMM and neural network context provide for redundant rows. During manufacturing and testing, rows containing one or more bad cells are identified and the address of such bad rows are recorded in a non-volatile table along with a mapping of that bad row to a particular redundant row. During operation, if an address is received for the bad row during a write or read operation, the system disables the reading or writing of that row and instead enables the reading or writing of the particular redundant row associated with the bad row in the non-volatile table.

FIG. 26 discloses prior art memory system 2600 that replaces rows containing one or more redundant rows. Memory system 2600 comprises address comparator 2601, inverter 2602, row decoder 2603, redundant row decoder 2604, array 2605, redundant array 2606, and table 2607. Table 2607 is populated during manufacturing and testing with the addresses for bad rows, XA'[10:0], and the addresses for the respective redundant rows, XRA[10:0], that are assigned to replace the respective bad rows. Table 2607 is stored in a non-volatile storage device such as a ROM, flash memory, or a set of fuses.

During a read or write operation, an address, XA[10:0], is received for the read or write operation. Address comparator 2601 compares that address to addresses for bad rows stored in table 2607. In this example, an example bad address XRA[10:0] is shown. If address comparator 2601 identifies a match, indicated by ADDR MATCH, then the received address XA[10:0] is a known bad address. The signal ADDR MATCH is applied to redundant row decoder 2604 as an enable signal EN_RED_XDEC, and the inverse of ADDR MATCH is applied to row decoder 2603 as a disable signal DISABLE_XDEC_B. Row decoder 2603 also receives the address XA[10:0]. However, because it receives the disable signal, row decoder 2603 takes no action on array 2605. Instead, redundant row decoder 2604 is enabled and enables the respective row in redundancy array 2606 corresponding to the respective redundant row that had previously been assigned to the respective bad row indicated by XA[10:0], which respective redundant row is obtained from table 2607 as XRA[10:0]. The write or read operation therefore is performed on the respective redundant row instead of the respective bad row.

This prior art redundancy mechanism does not work for a neural read operation in a VMM in an artificial neural network because during a neural read operation, multiple rows are read at one time, and there is no individual address XA received which can form the basis of a comparison against a set of addresses for known bad rows. Therefore, a redundancy mechanism is needed for artificial neural networks for use during neural read operations.

SUMMARY OF THE INVENTION

Numerous examples are disclosed of circuitry and methods to implement redundancy in in an array of non-volatile memory cells using tag registers.

BRIEF DESCRIPTION OF THE DRAWINGS

FIG. 4 depicts another prior art split gate flash memory cell.

FIG. 15 depicts another example of a VMM system.

FIG. 16 depicts another example of a VMM system.

FIG. 26 depicts a prior art memory system with redundancy.

FIG. 30 depicts a row tag register loading circuit.

FIG. 31 depicts a row register loading circuit.

FIG. 32 depicts a row register load operation.

FIG. 33 depicts a row tag register load operation.

FIG. 34 depicts a neural read method.

FIG. 35 depicts an output block for implementing column redundancy in a VMM array.

FIG. 36 depicts a neural read method.

DETAILED DESCRIPTION OF THE INVENTION

VMM System Architecture

Figure 1:
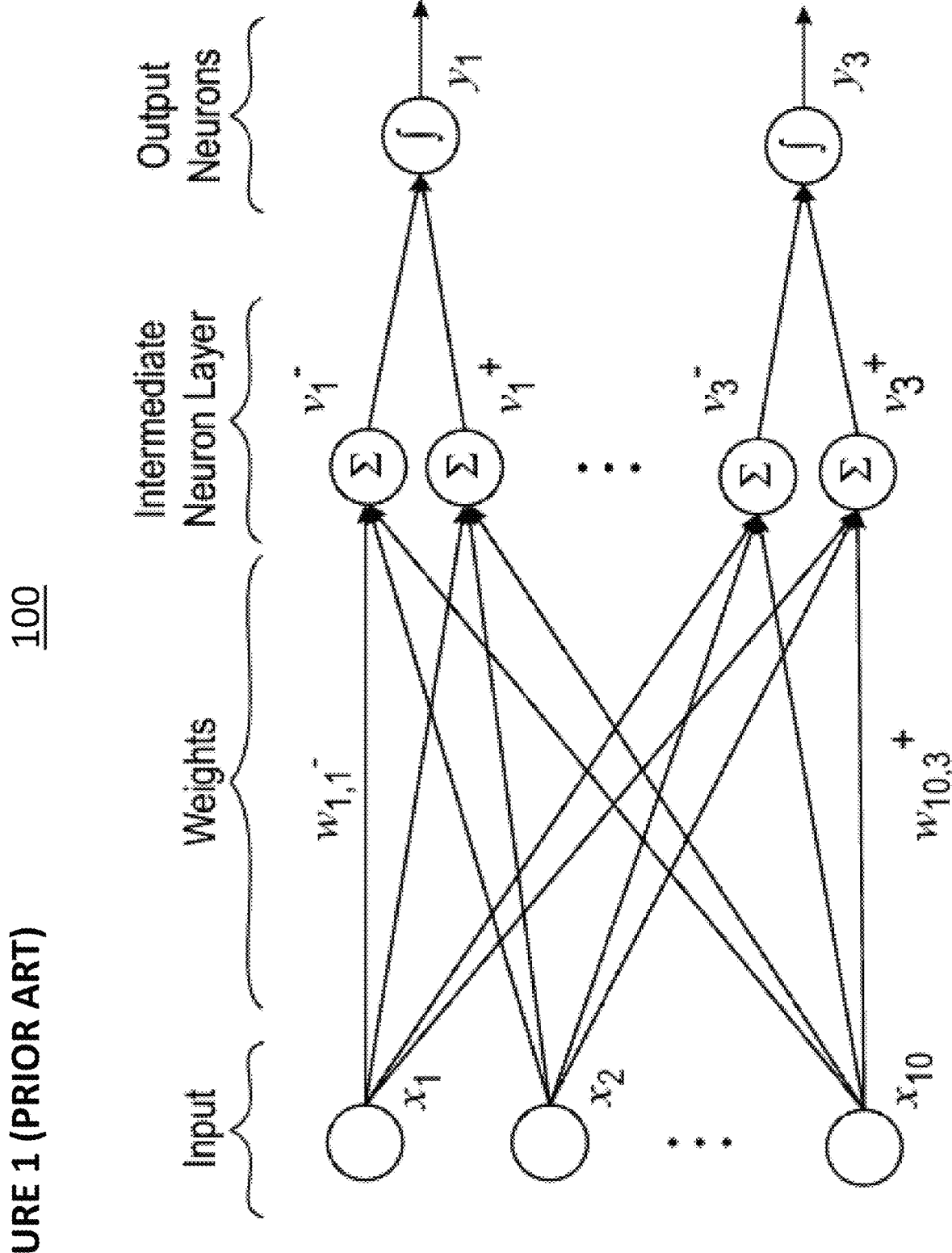
FIG. 1 is a diagram that illustrates an artificial neural network.
Figure 2:
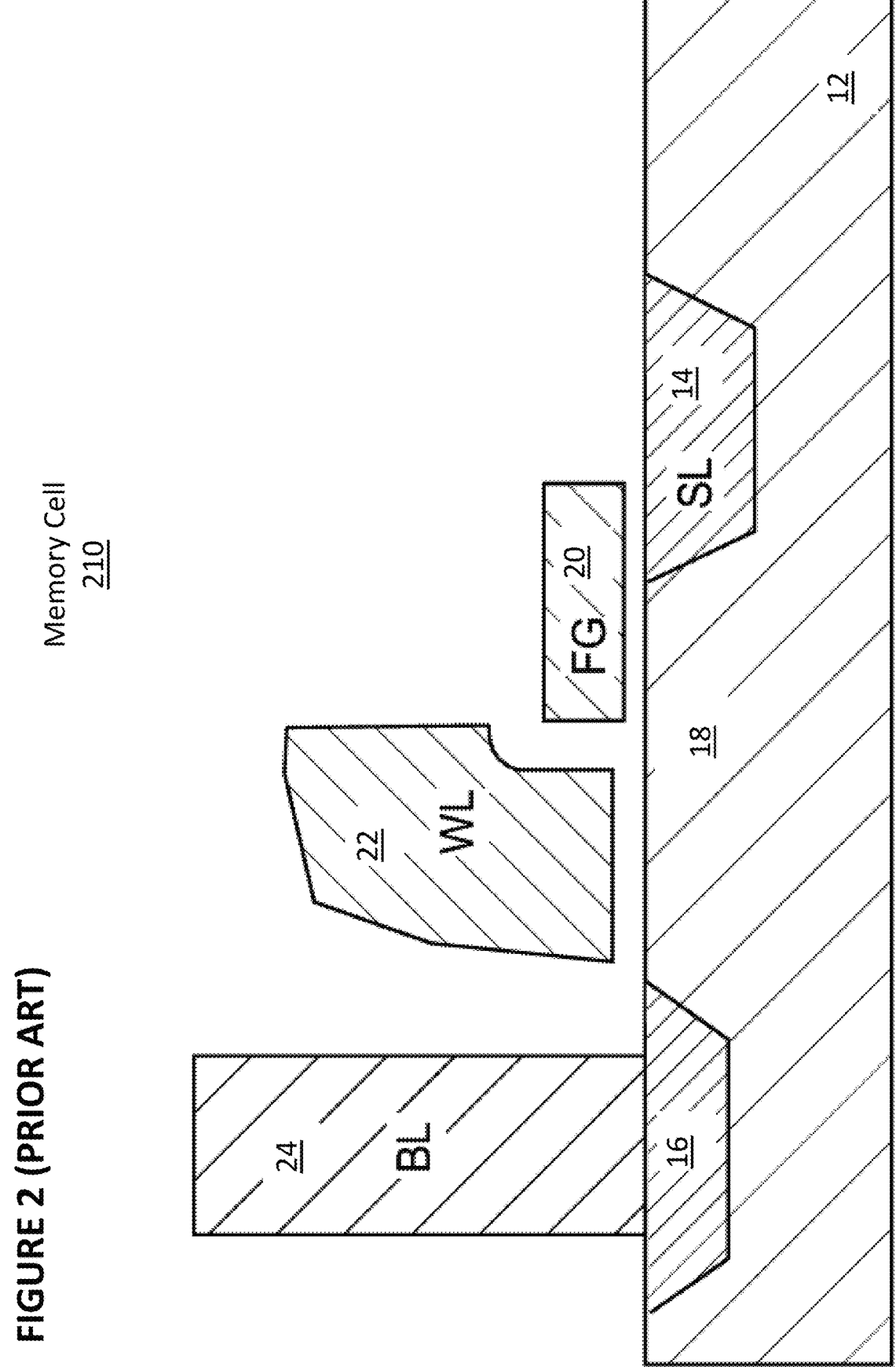
FIG. 2 depicts a prior art split gate flash memory cell.
Figure 3:
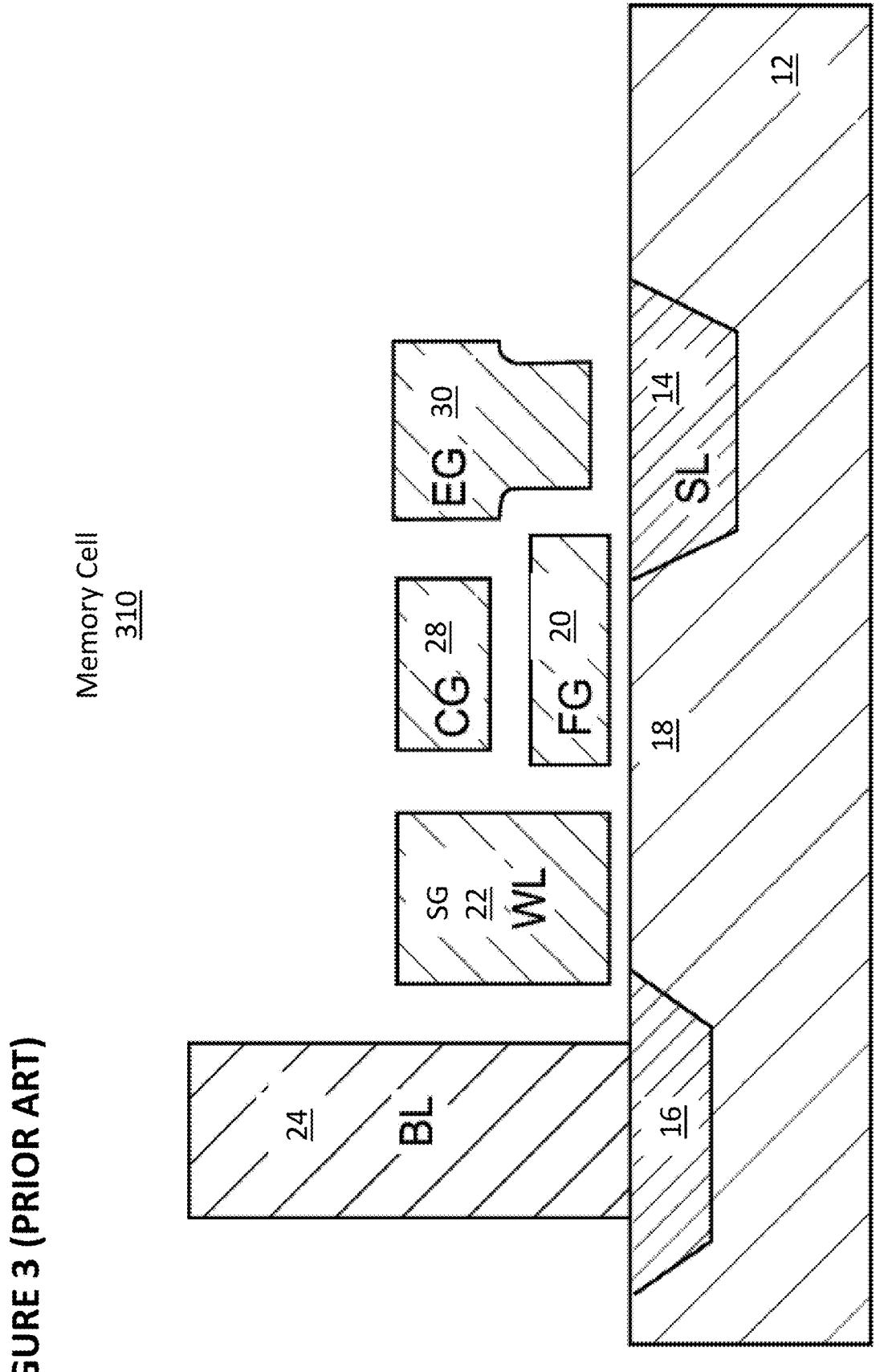
FIG. 3 depicts another prior art split gate flash memory cell.
Figure 5:
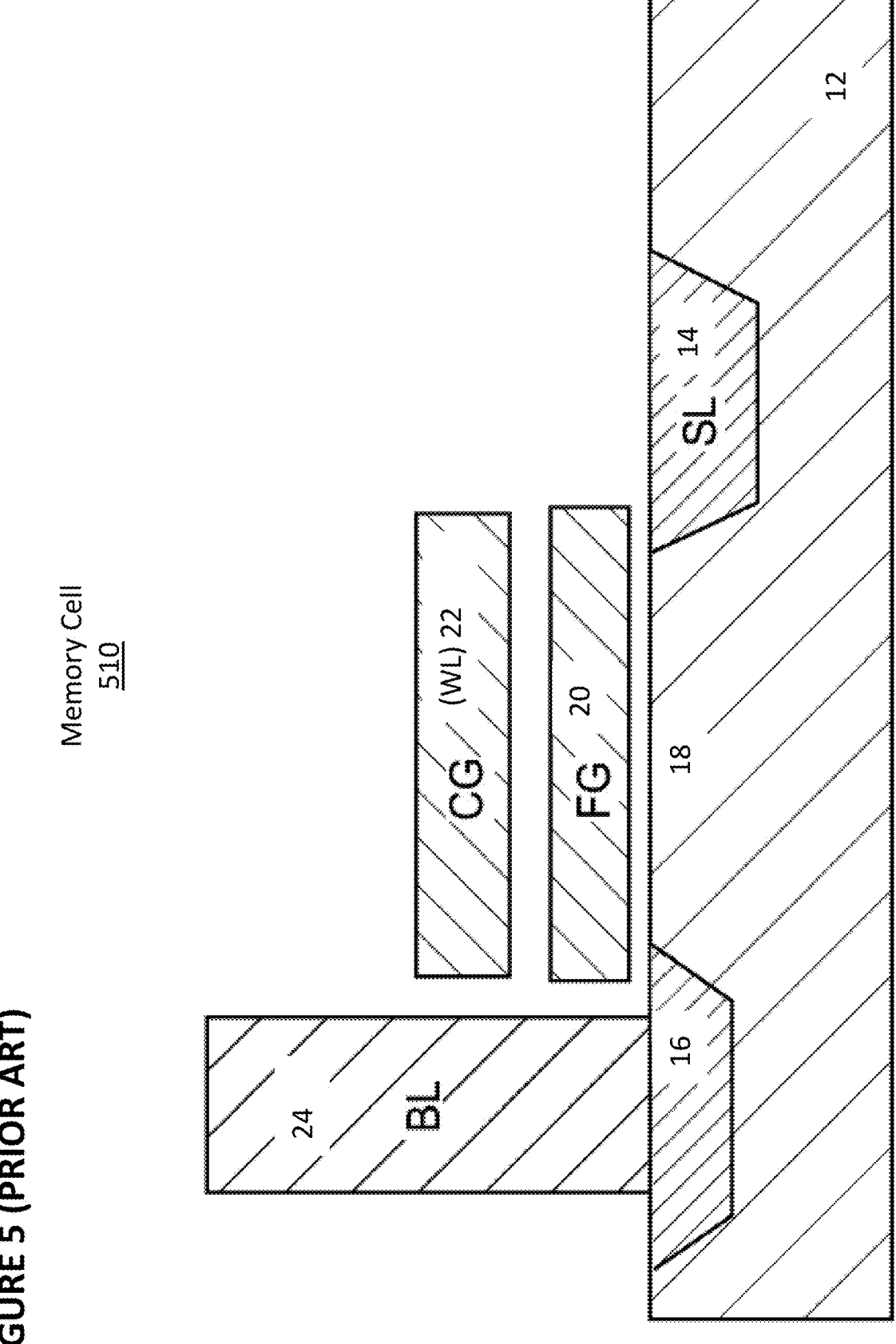
FIG. 5 depicts another prior art split gate flash memory cell.
Figure 6:
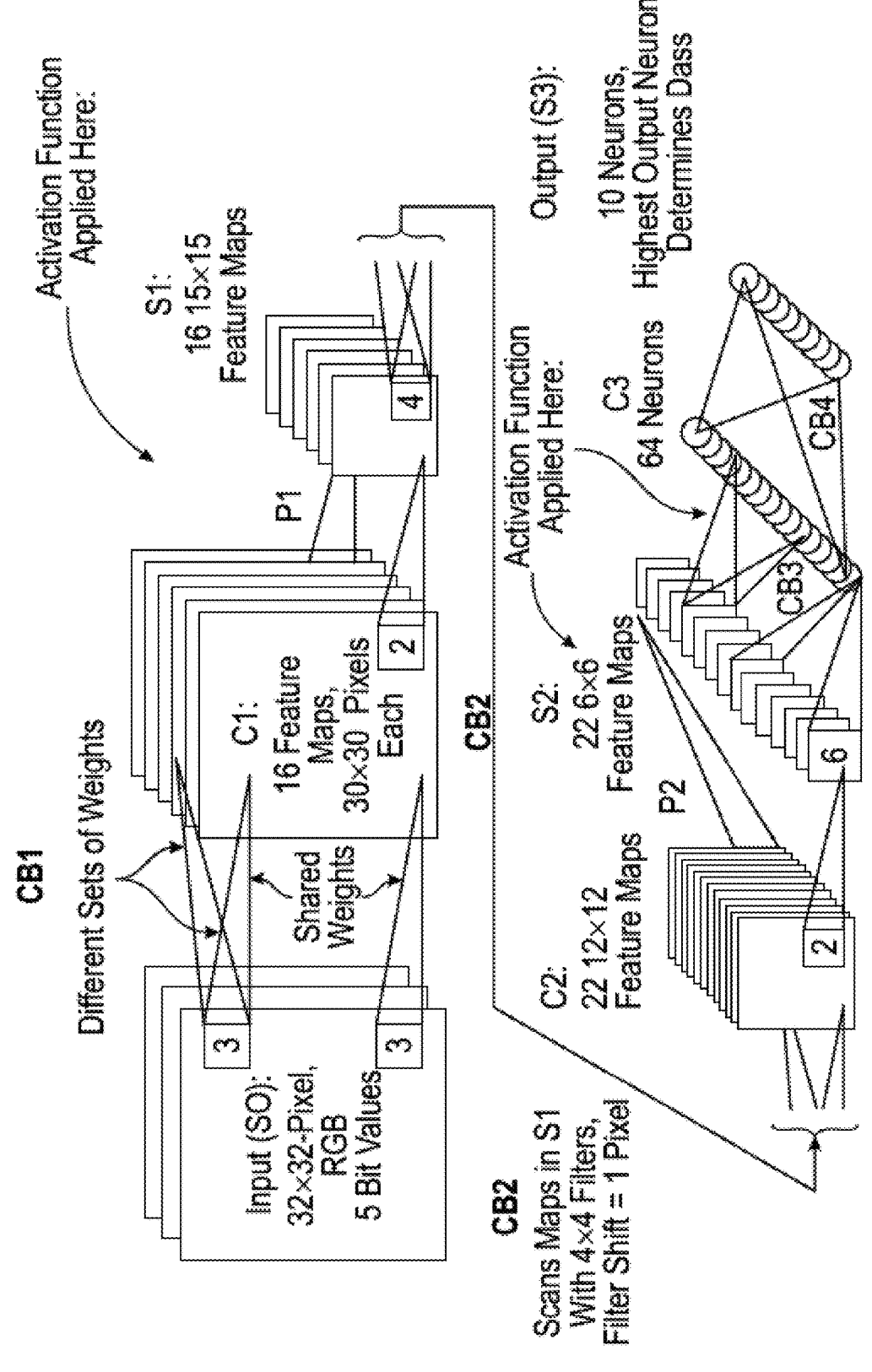
FIG. 6 is a diagram illustrating the different levels of an artificial neural network utilizing one or more non-volatile memory arrays.
Figure 7:
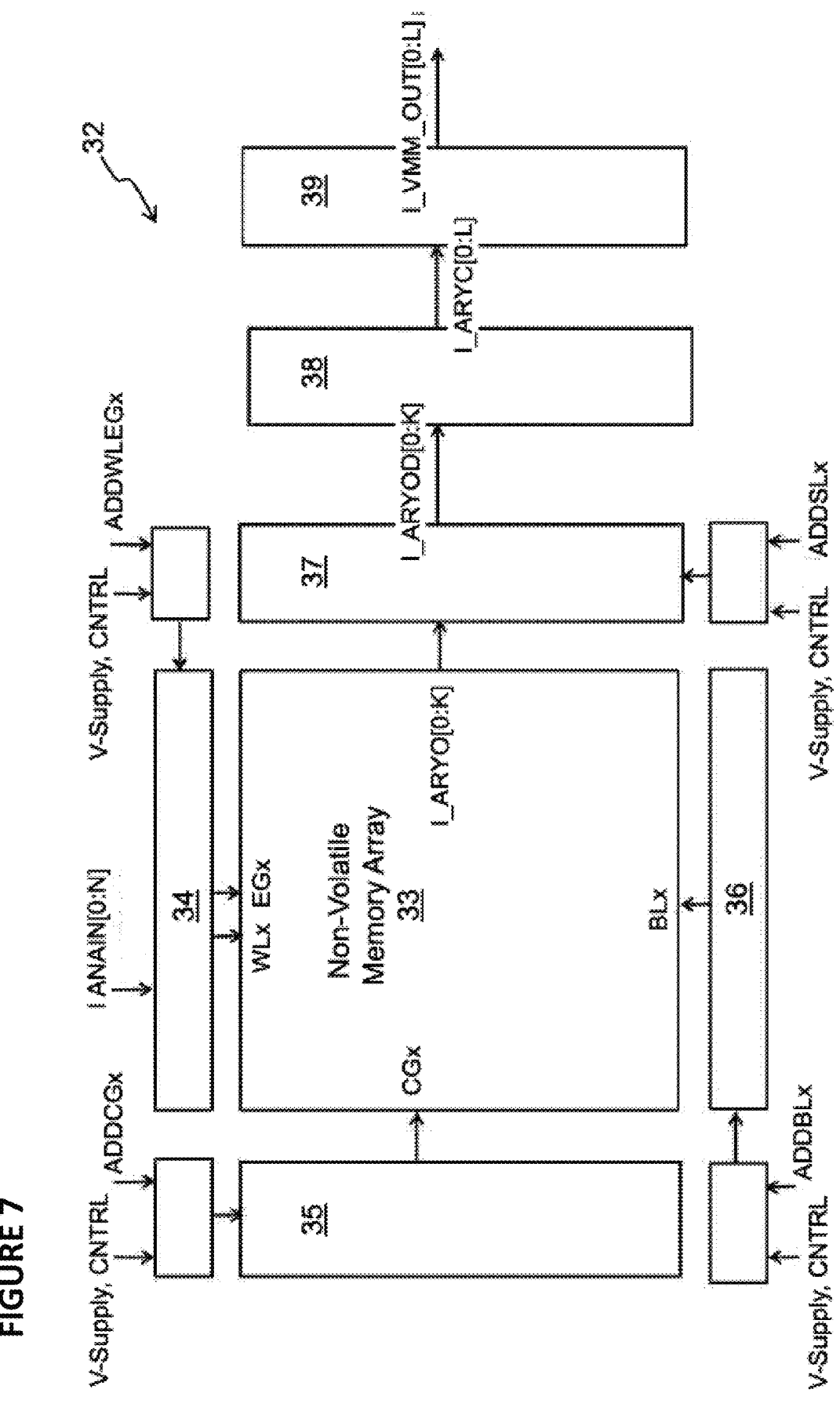
FIG. 7 is a block diagram illustrating a VMM system.
Figure 8:
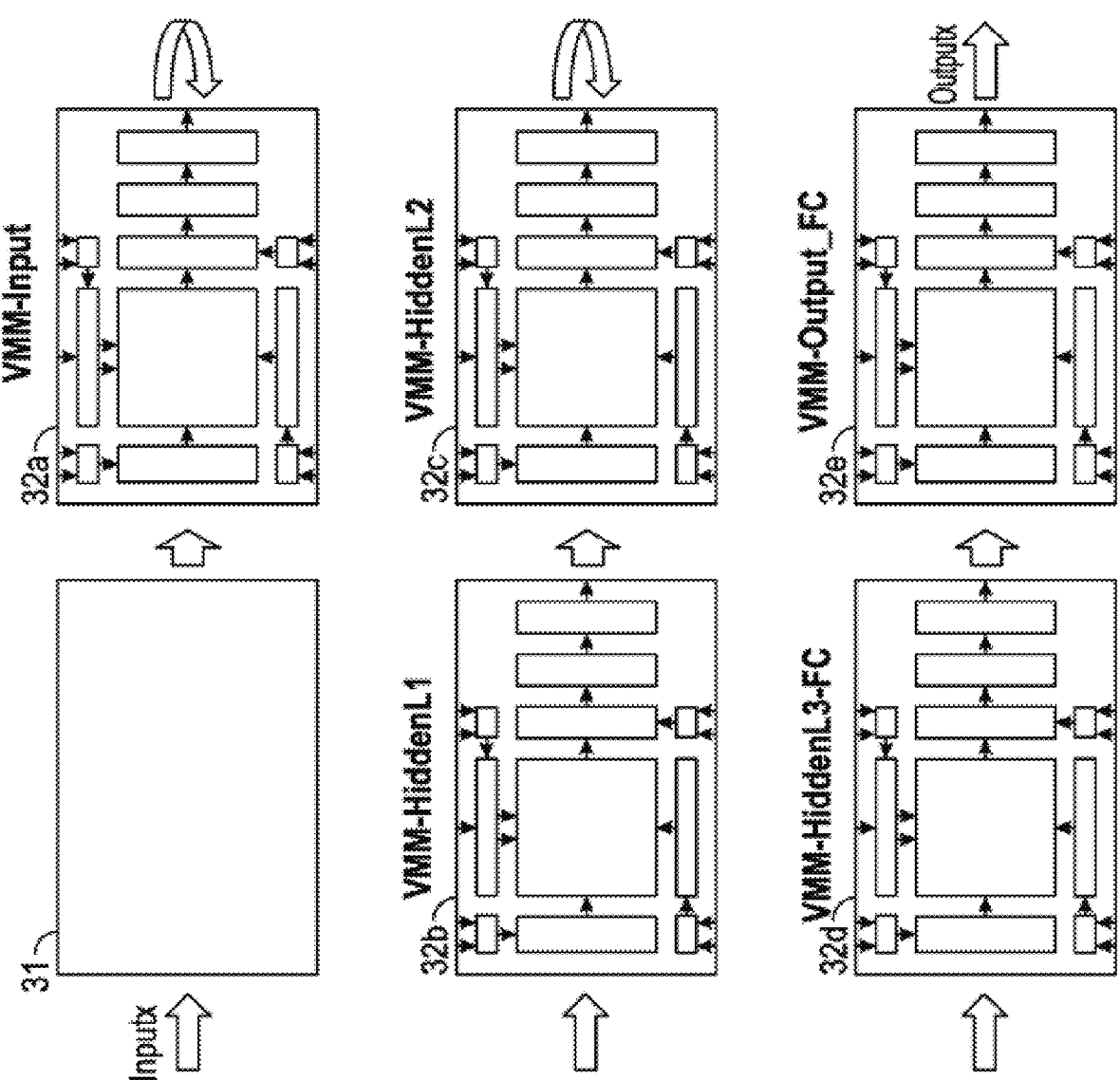
FIG. 8 is a block diagram illustrates an example artificial neural network utilizing one or more VMM systems.
Figure 9:
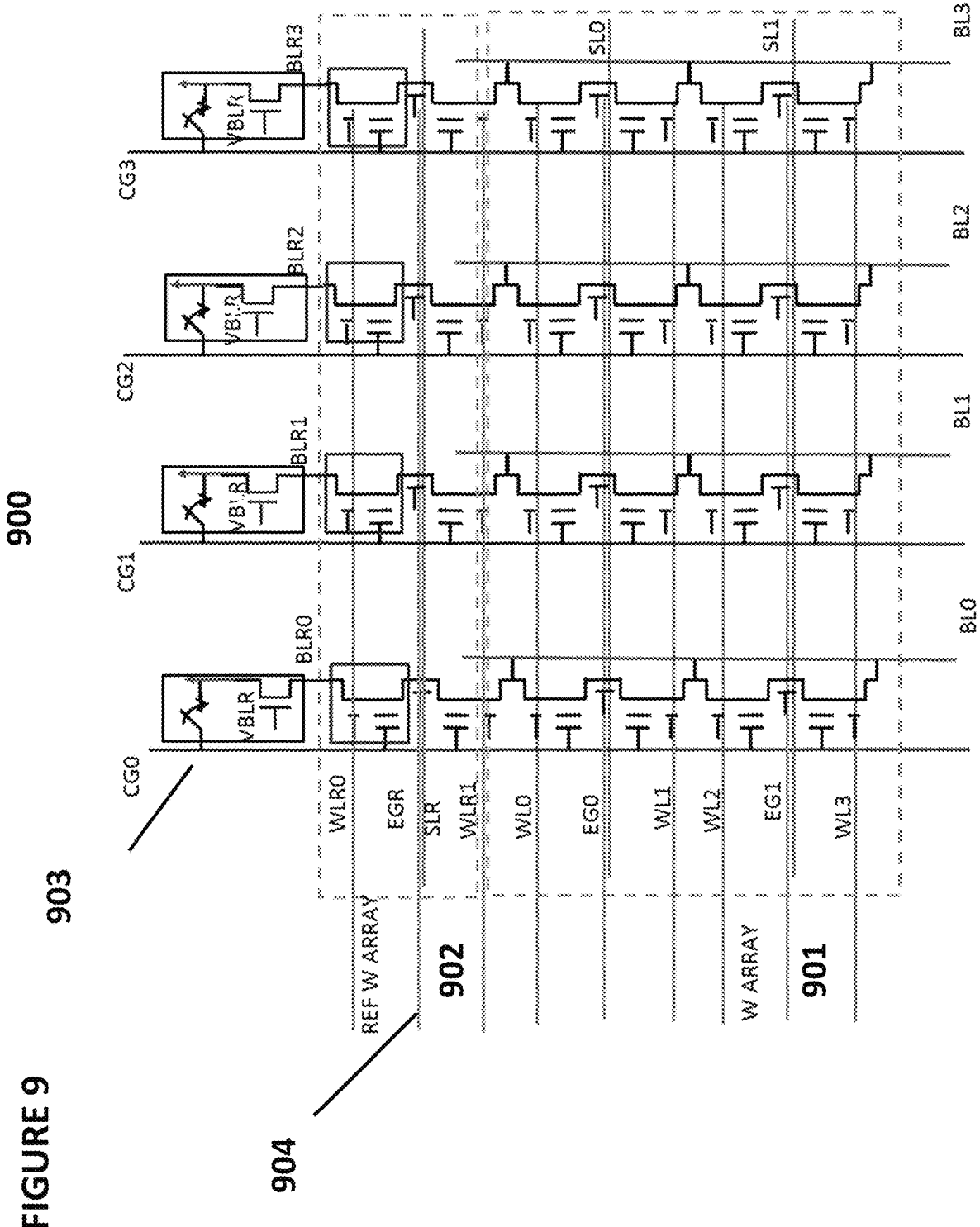
FIG. 9 depicts another example of a VMM system.
Figure 10:
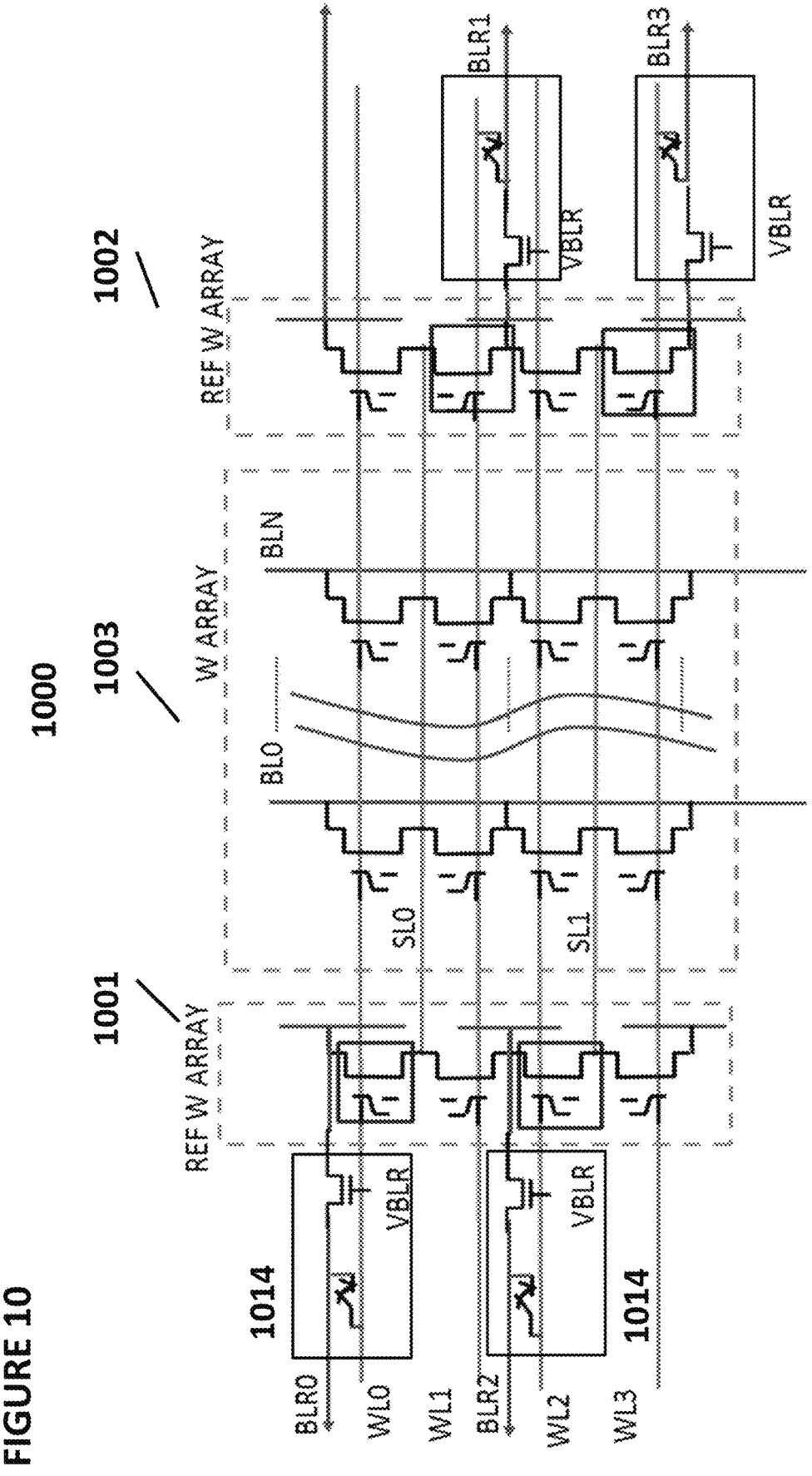
FIG. 10 depicts another example of a VMM system.
Figure 11:
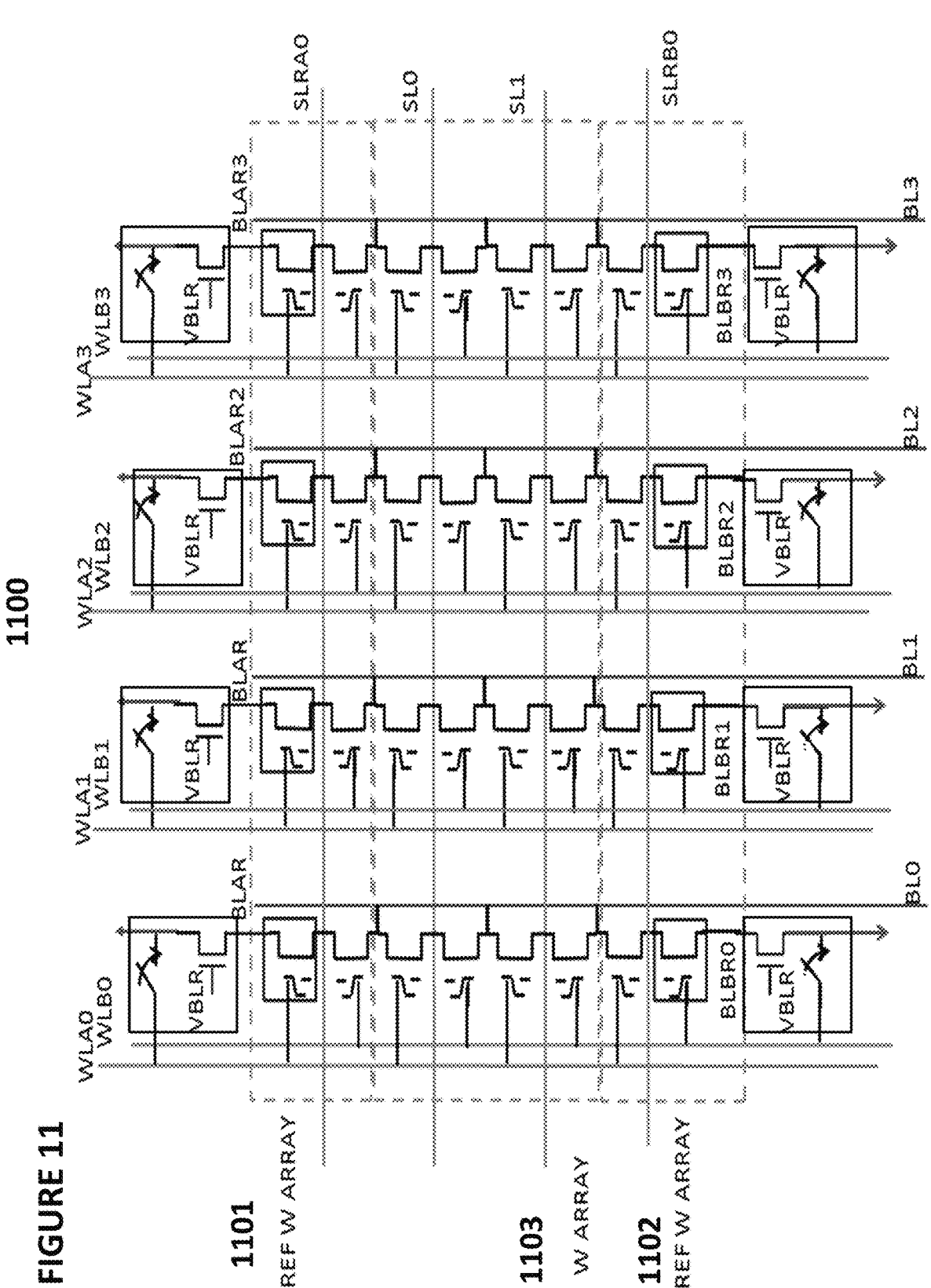
FIG. 11 depicts another example of a VMM system.
Figure 12:
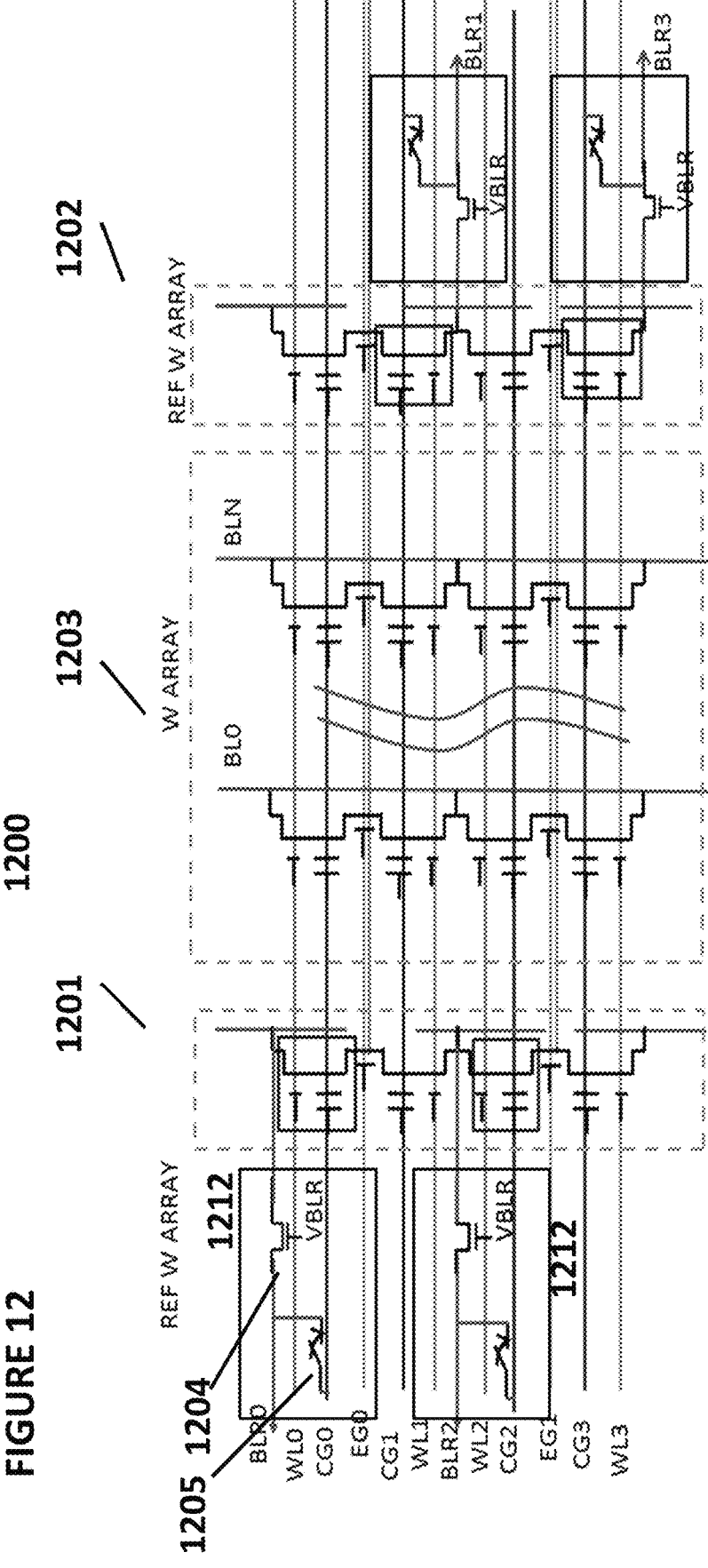
FIG. 12 depicts another example of a VMM system.
Figure 13:
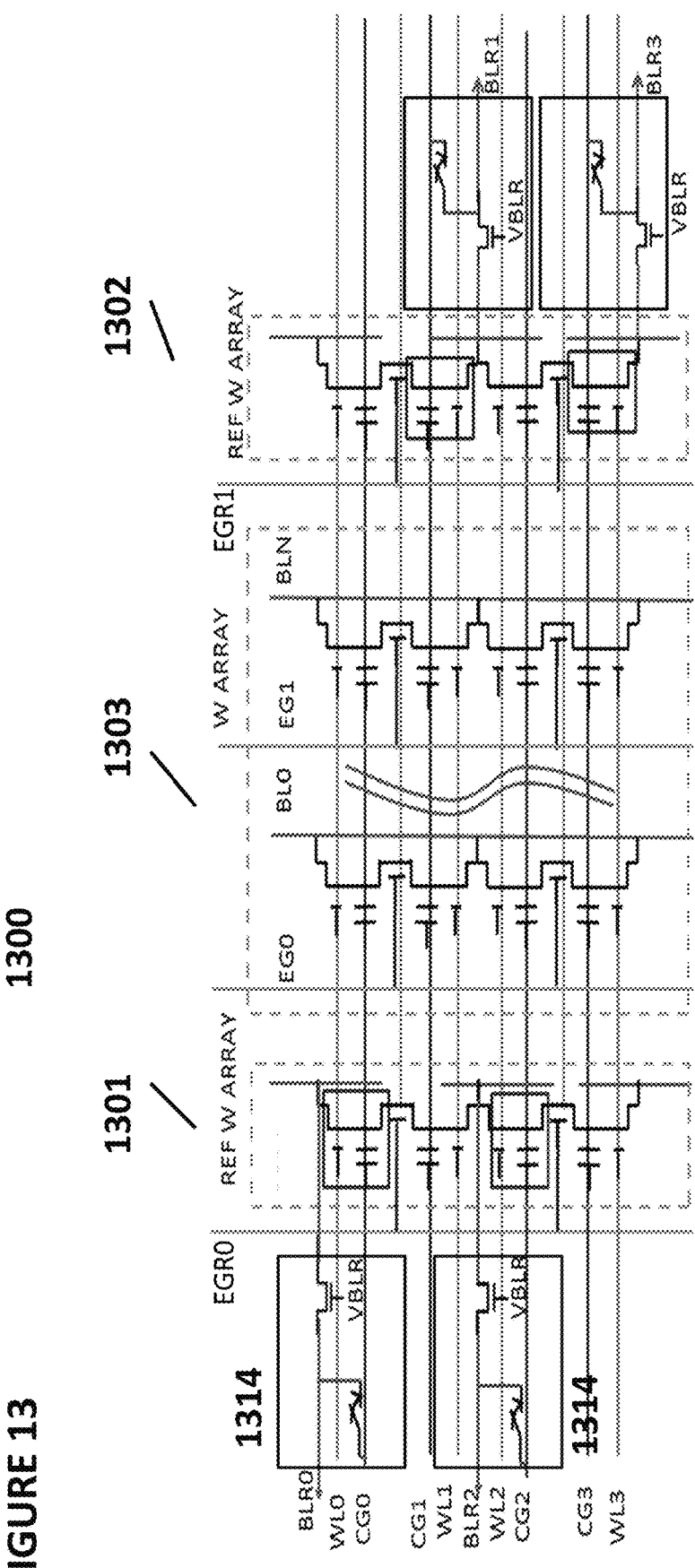
FIG. 13 depicts another example of a VMM system.
Figure 14:
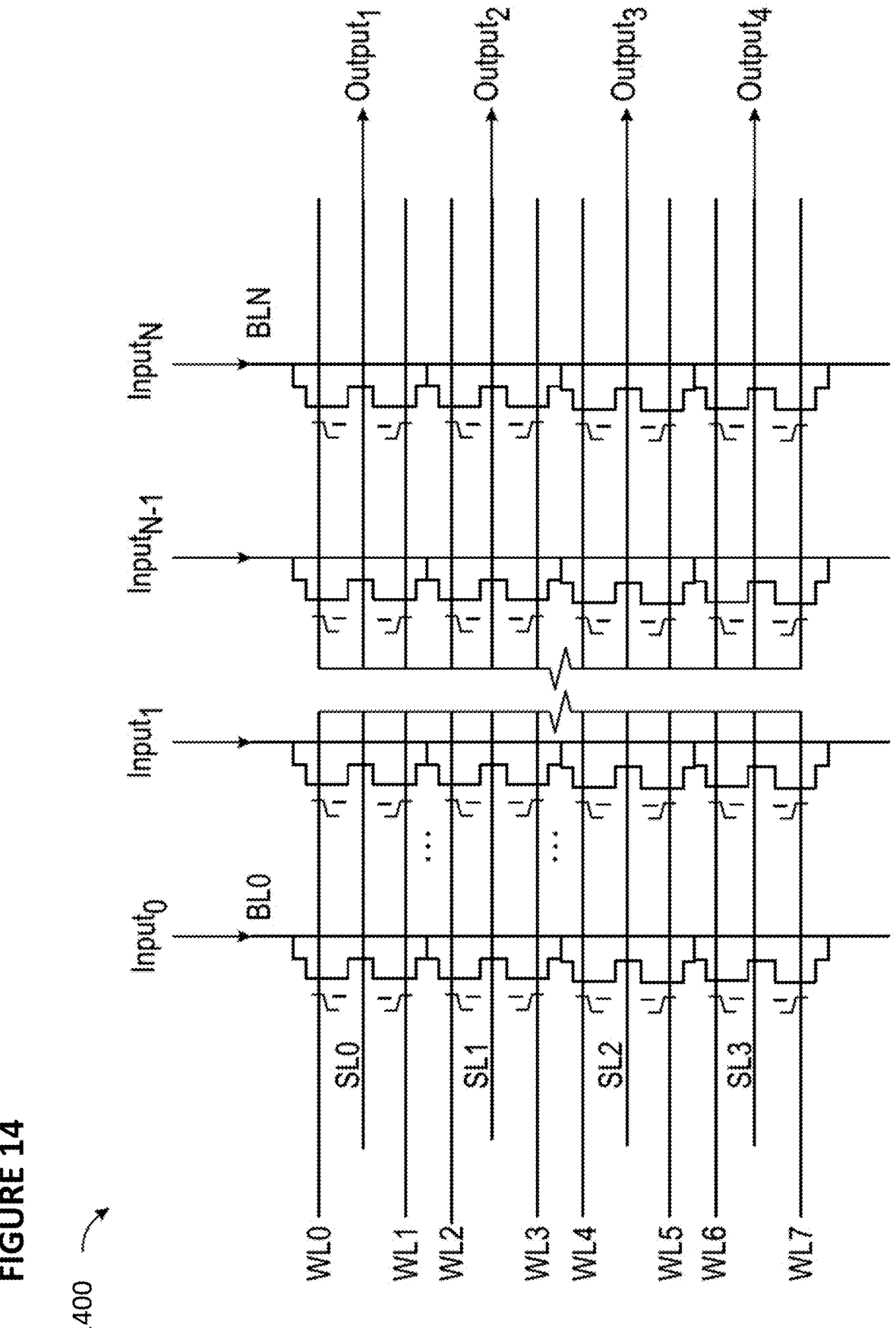
FIG. 14 depicts another example of a VMM system.
Figure 17:
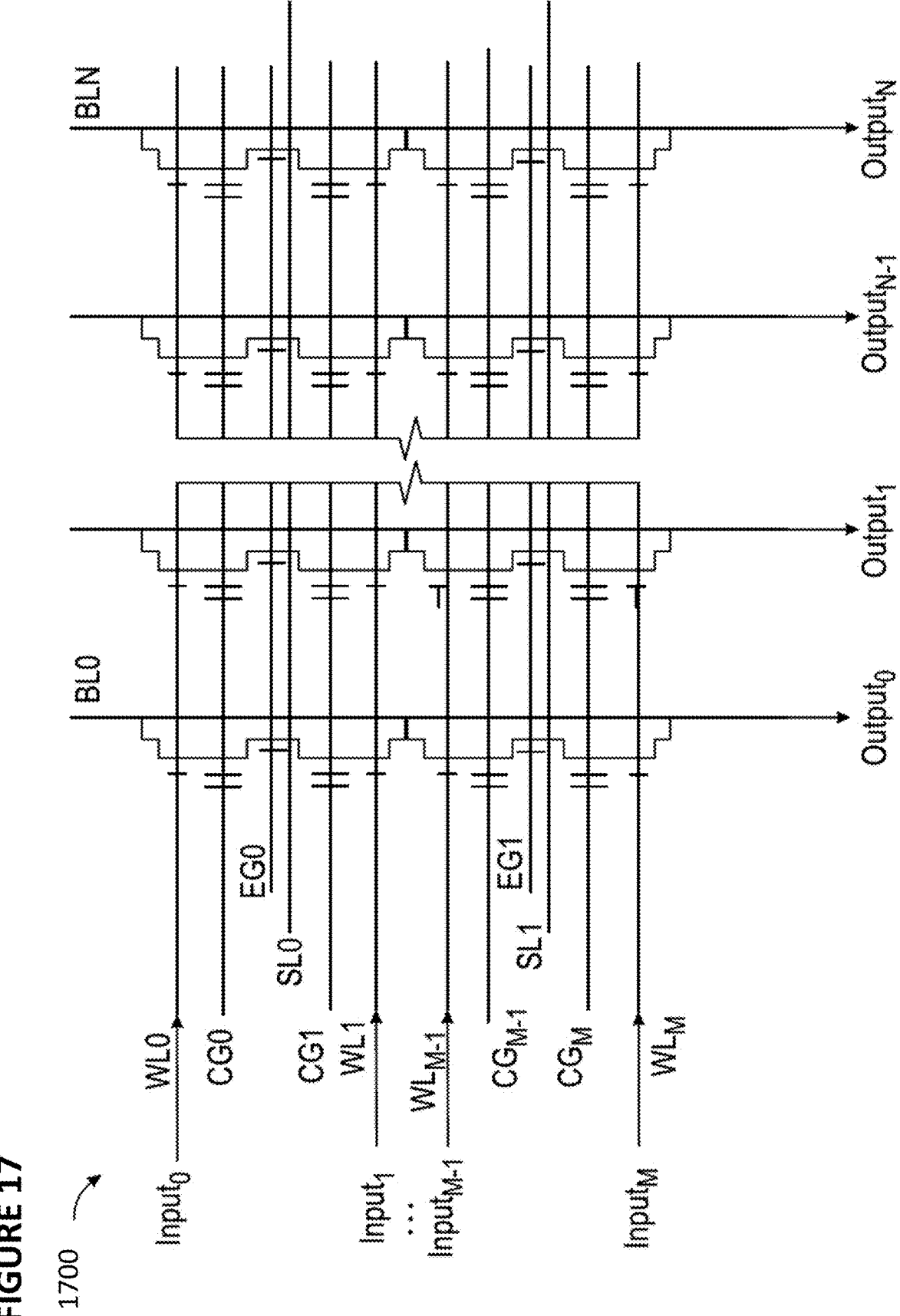
FIG. 17 depicts another example of a VMM system.
Figure 18:
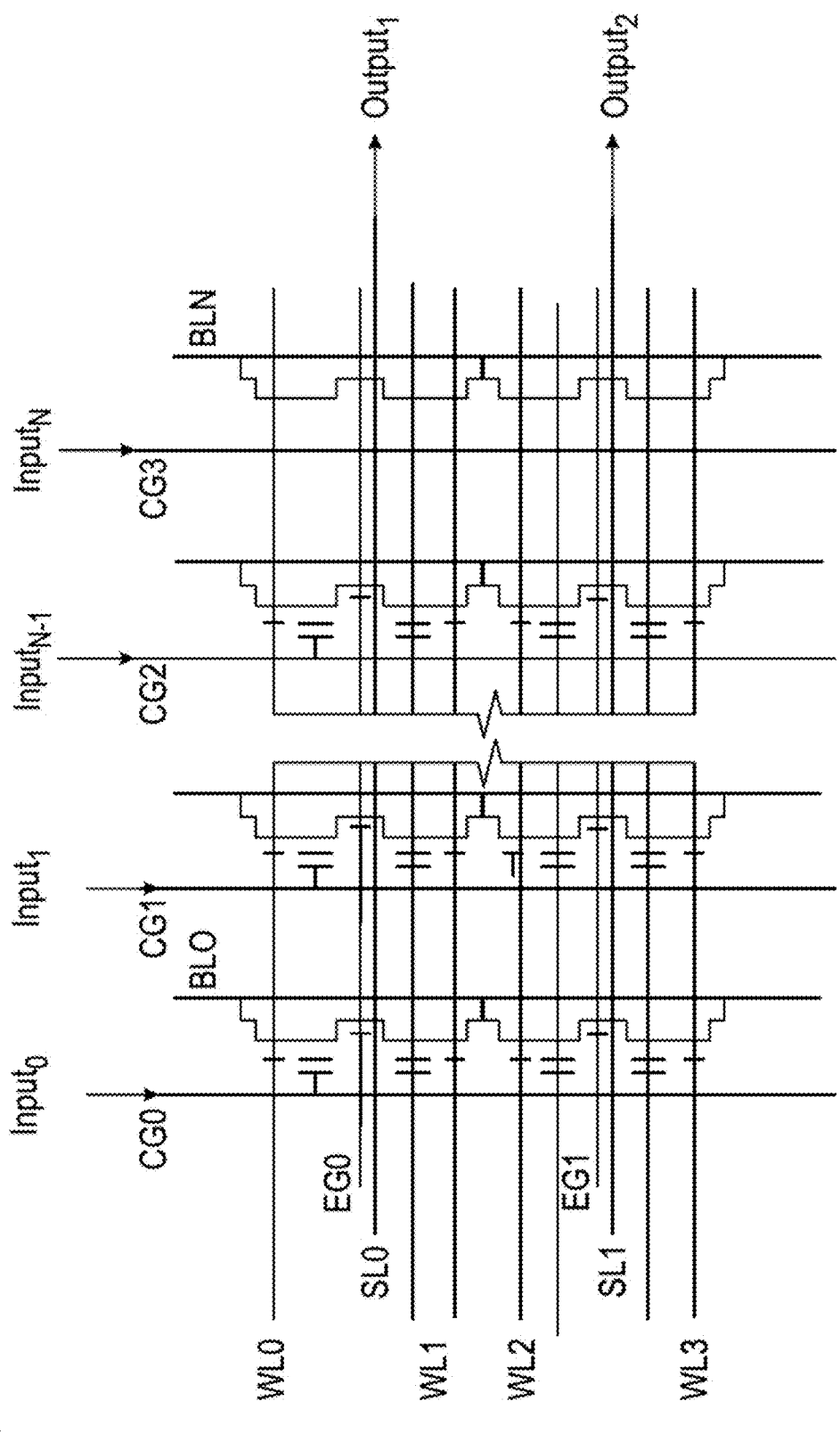
FIG. 18 depicts another example of a VMM system.
Figure 19:
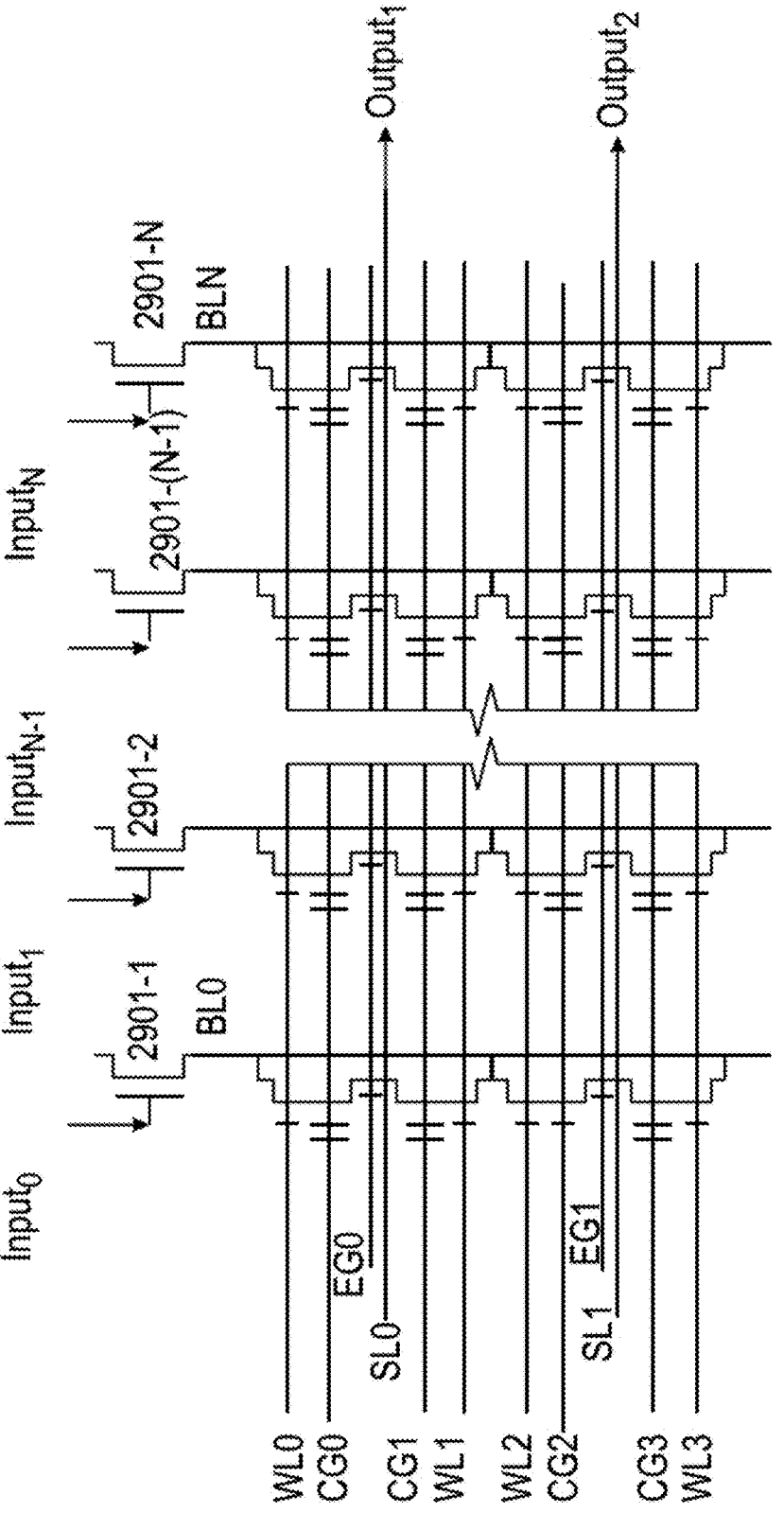
FIG. 19 depicts another example of a VMM system.
Figure 20:
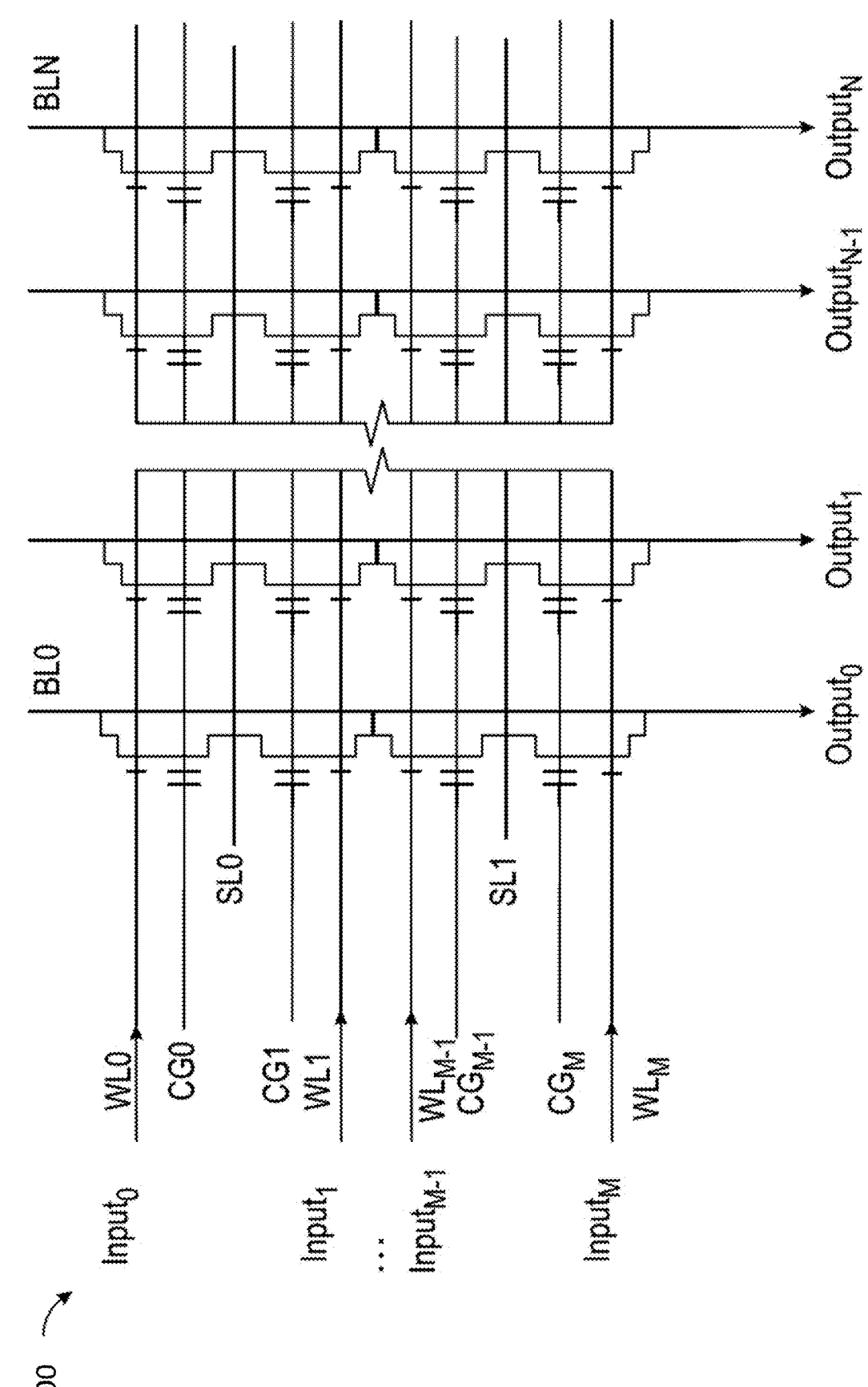
FIG. 20 depicts another example of a VMM system.
Figure 21:
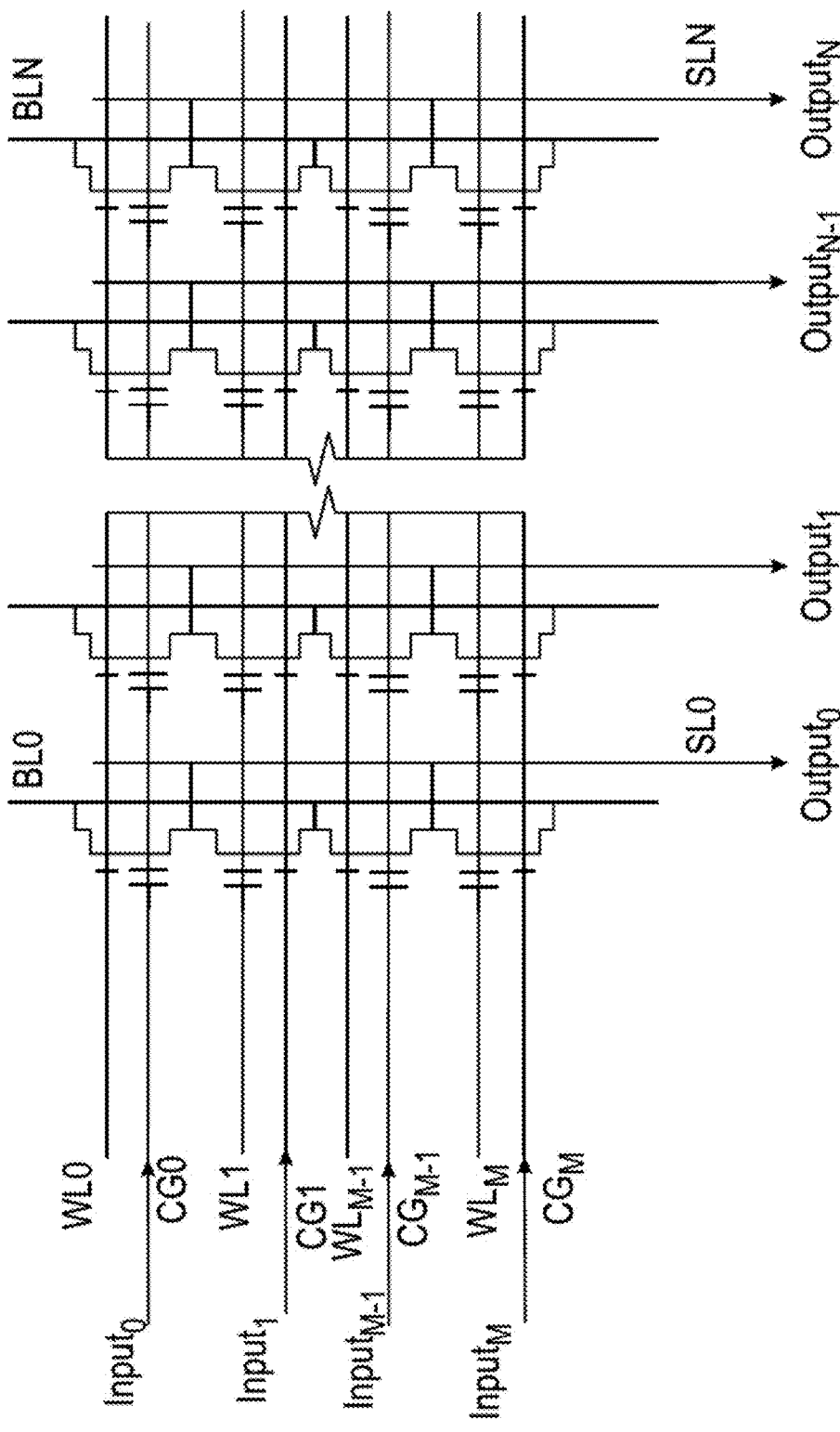
FIG. 21 depicts another example of a VMM system.
Figure 22:
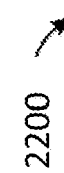
FIG. 22 depicts another example of a VMM system.
Figure 23:
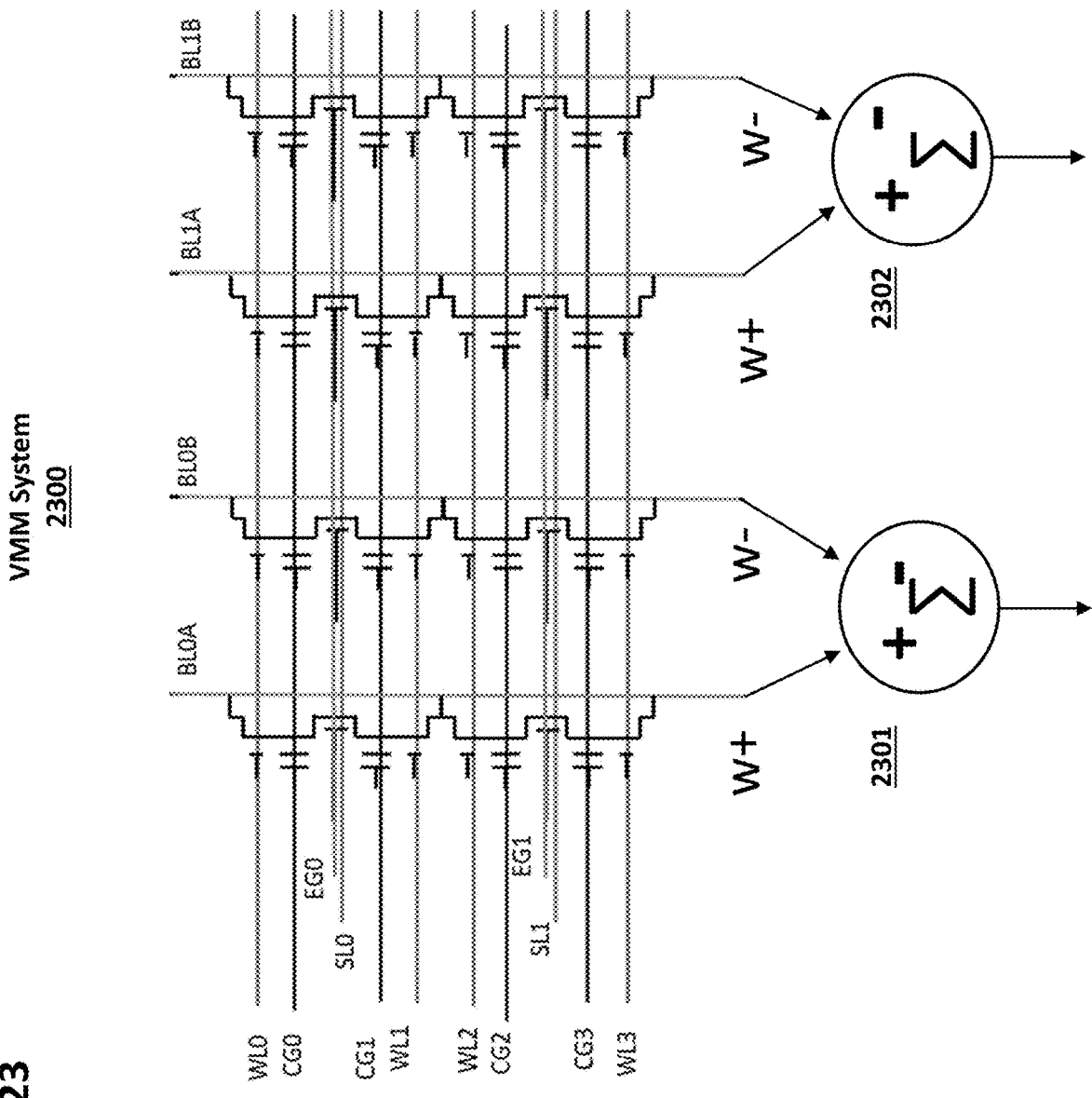
FIG. 23 depicts another example of a VMM system.
Figure 24:
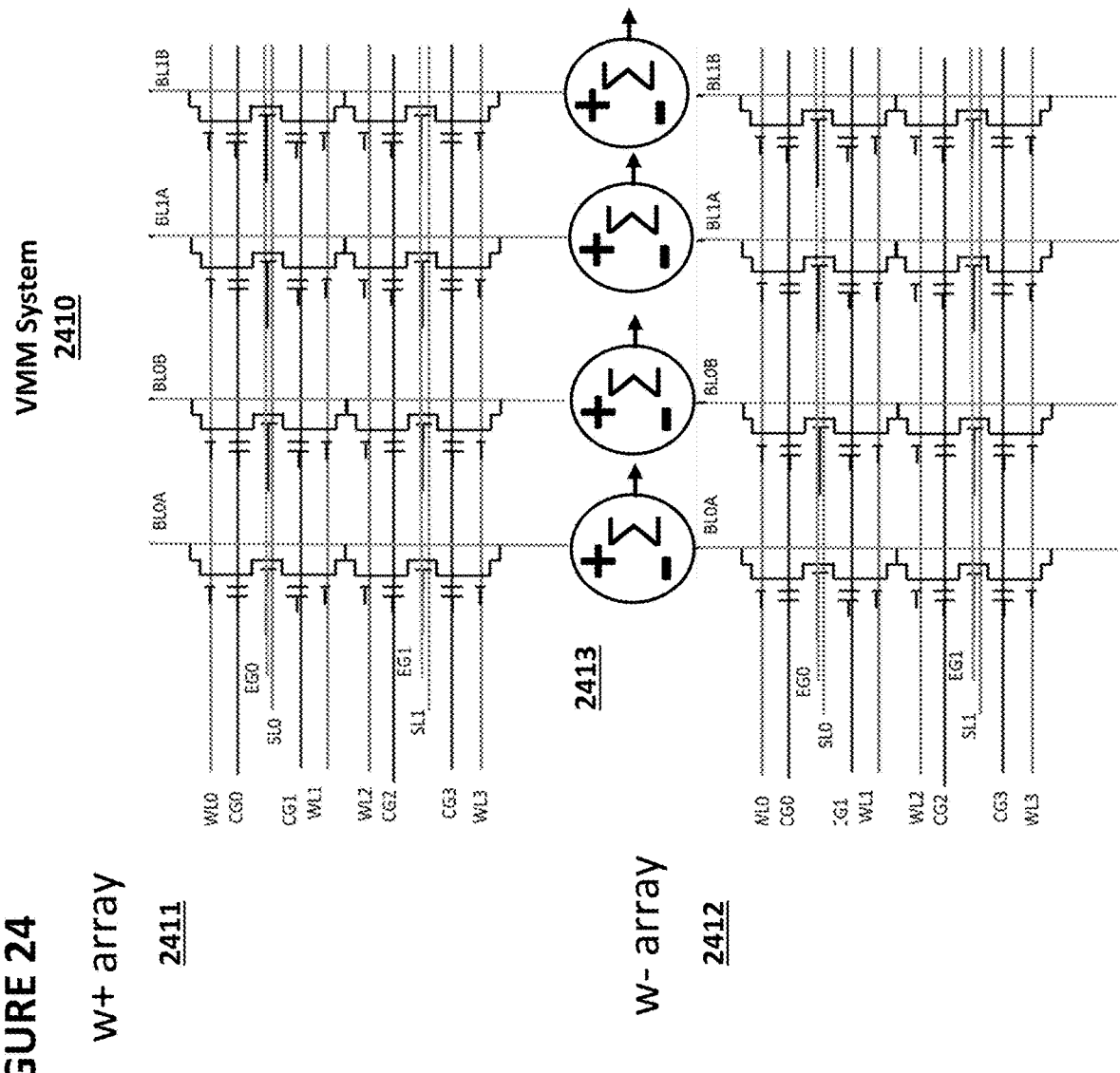
FIG. 24 depicts another example of a VMM system.
Figure 25:
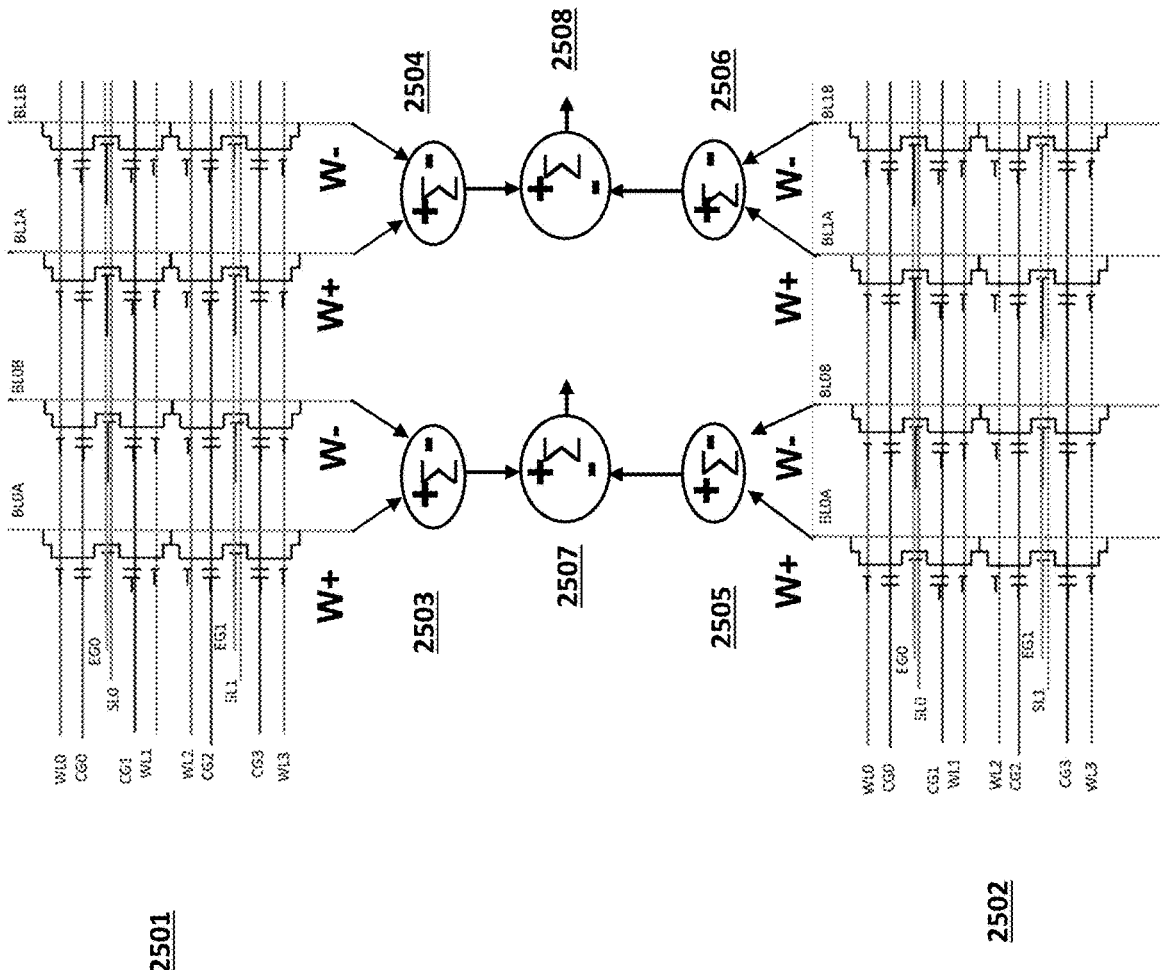
FIG. 25 depicts another example of a VMM system.
Figure 27:
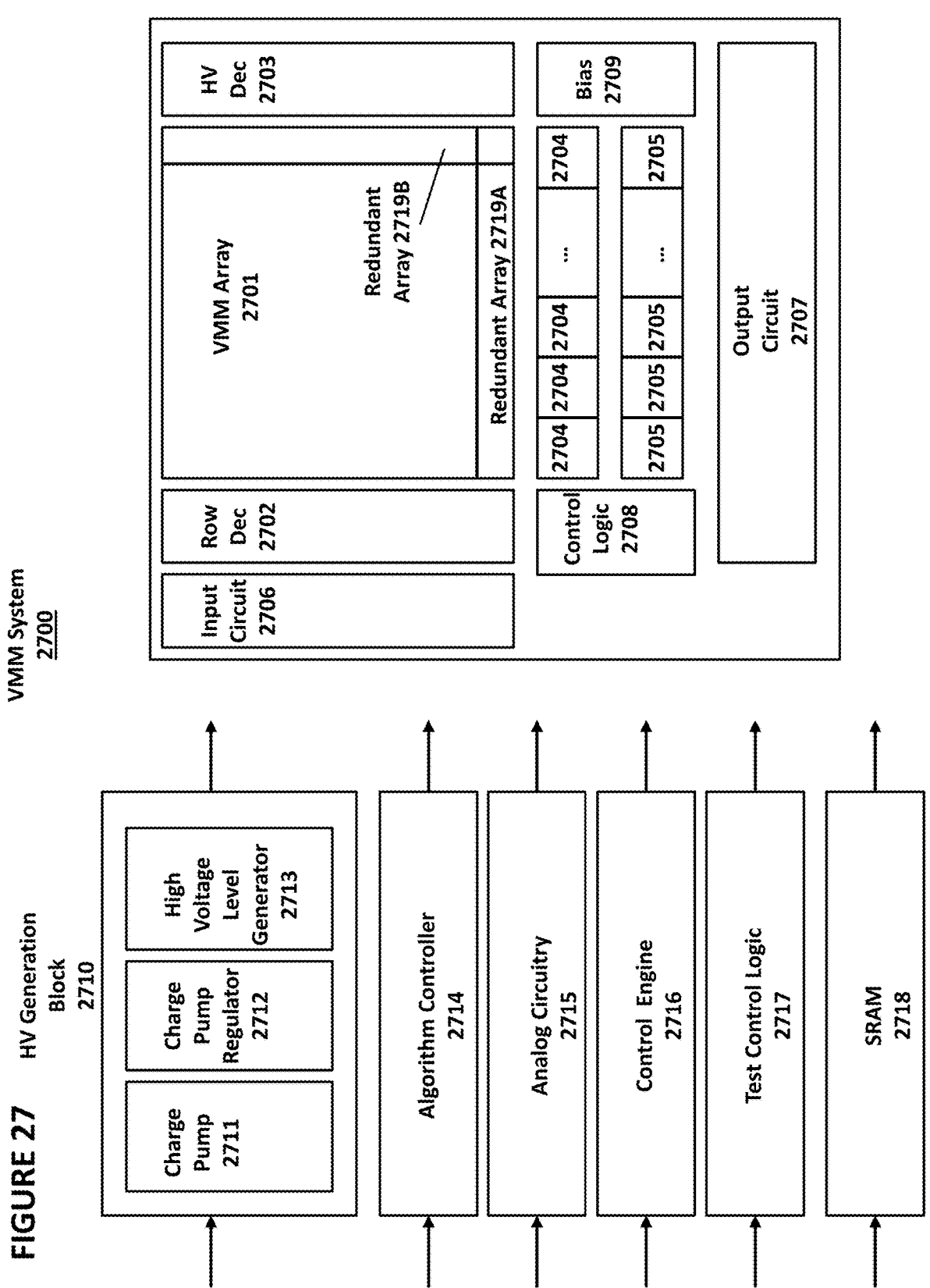
FIG. 27 depicts a VMM system.

FIG. 27 depicts a block diagram of VMM system 2700. VMM system 2700 comprises VMM array 2701, redundant array 3519A (redundant row array), redundant array 3519B (redundant column array), row decoder 2702, high voltage decoder 2703, column decoders 2704, bit line drivers 2705 (such as bit line control circuitry for programming), input circuit 2706, output circuit 2707, control logic 2708, and bias generator 2709. VMM system 2700 further comprises high voltage generation block 2710, which comprises charge pump 2711, charge pump regulator 2712, and high voltage level generator 2713. VMM system 2700 further comprises (program/erase, or weight tuning) algorithm controller 2714, analog circuitry 2715, control engine 2716 (that may include functions such as arithmetic functions, activation functions, embedded microcontroller logic, without limitation), test control logic 2717, and static random access memory (SRAM) block 2718 to store intermediate data such as for input circuits (e.g., activation data) or output circuits (neuron output data, partial sum output neuron data) or data in for programming (such as data in for a whole row or for multiple rows). Here, redundant arrays 3519A and 3519B are shown as part of the same physical array as VMM array 2701, but a person of ordinary skill in the art will appreciate that redundant arrays 3519A and 3519B and VMM array 2701 instead could be located in respective separate physical arrays.

The input circuit 2706 may include circuits such as a DAC (digital to analog converter), DPC (digital to pulses converter, digital to time modulated pulse converter), AAC (analog to analog converter, such as a current to voltage converter, logarithmic converter), PAC (pulse to analog level converter), or any other type of converter. The input circuit 2706 may implement one or more of normalization, linear or non-linear up/down scaling functions, or arithmetic functions. The input circuit 2706 may implement a temperature compensation function for input levels. The input circuit 2706 may implement an activation function such as ReLU or sigmoid. Input circuit 2706 may store digital activation data to be applied as, or combined with, an input signal during a program or read operation. The digital activation data can be stored in registers. Input circuit 2706 may comprise circuits to drive the array terminals, such as CG, WL, EG, and SL lines, which may include sample-and-hold circuits and buffers. A DAC can be used to convert digital activation data into an analog input voltage to be applied to the array.

The output circuit 2707 may include circuits such as an ITV (current-to-voltage circuit), ADC (analog to digital converter, to convert neuron analog output to digital bits), AAC (analog to analog converter, such as a current to voltage converter or logarithmic converter, without limitation), APC (analog to pulse(s) converter, analog to time modulated pulse converter), or any other type of converter. The output circuit 2707 may convert array outputs into activation data. The output circuit 2707 may implement an activation function such as rectified linear activation function (ReLU) or sigmoid. The output circuit 2707 may implement one or more of statistic normalization, regularization, up/down scaling/gain functions, statistical rounding, or arithmetic functions (e.g., add, subtract, divide, multiply, shift, log) for neuron outputs. The output circuit 2707 may implement a temperature compensation function for neuron outputs or array outputs (such as bitline output) so as to keep power consumption of the array approximately constant over temperature or to improve precision of the array (neuron) outputs such as by keeping the IV slope approximately the same over temperature. The output circuit 2707 may comprise registers for storing output data.

VMM array 2701, redundant array 3519A, and redundant array 3519B respectively comprise an array of non-volatile memory cells arranged into rows and columns, where the non-volatile memory cells are of the type shown in FIG. 2, 3, 4, or 5 as memory cells 210, 310, 410, or 510, respectively, or are of other types known to persons of ordinary skill in the art. In one example, the non-volatile memory cells are split-gate flash memory cells as in FIG. 2, 3, or 4. In another example, the non-volatile memory cells are stacked-gate flash memory cells as in FIG. 5.

Figure 28:
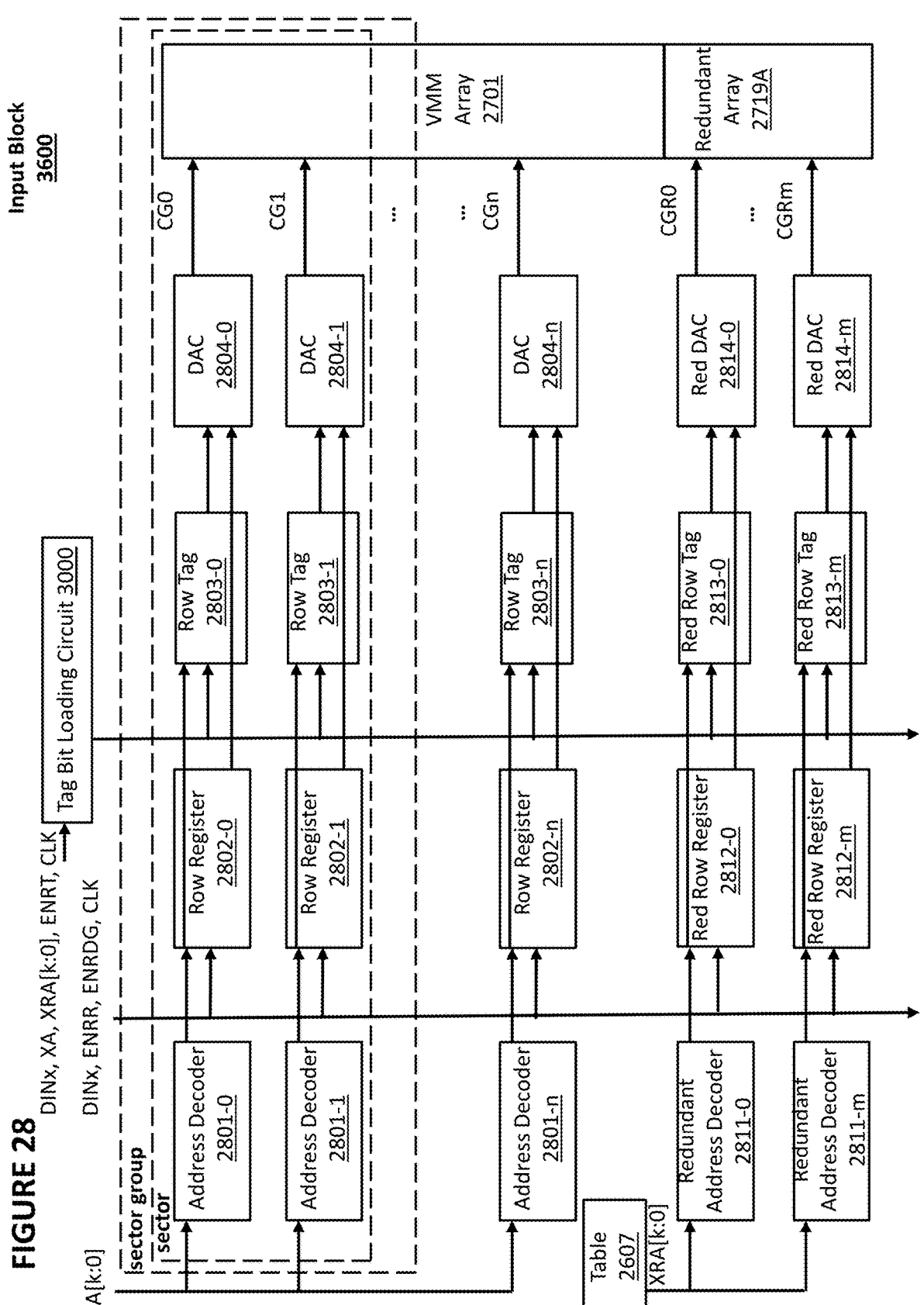
FIG. 28 depicts an example input block for implementing row redundancy in a VMM array.

FIG. 28 depicts input block 2800, which provides row (or sector) redundancy during a neural read operation of VMM array 2701. Input block 2800 comprises address decoders 2801-0 through 2801-n, respectively corresponding to one of the row numbers 0 through n in VMM array 2701; redundant address decoders 2811-0 through 2811-m, respectively corresponding to one of the redundant row numbers 0 through m in redundant array 3519A; row registers 2802-0 through 2802-n, respectively corresponding to one of the rows numbered 0 through n in VMM array 2701, and coupled to associated address decoders 2801; redundant row registers 2812-0 through 2812-m, respectively corresponding to one of the redundant row numbers 0 through m in redundant array 3519A and coupled to associated redundant address decoders 2811; row tag registers 2803-0 through 2803-n, respectively corresponding to one of the row numbers 0 through n in VMM array 2701 and coupled to associated address decoders 2801 and row registers 2802; redundant row tag registers 2813-0 through 2813-m, respectively corresponding to one of the redundant row numbers 0 through m in redundant array 3519A and coupled to associated redundant address decoders 2811 and redundant row registers 2812; digital-to-analog (DAC, which may be called a row DAC, or a local DAC) converters 2804-0 through 2804-n, respectively corresponding to one of the row numbers 0 through n in VMM array 2701, and coupled to associated row registers 2802 and row tag registers 2803; and redundant digital-to-analog converters 2814-0 through 2814-m, respectively corresponding to one of the rows numbered 0 through m in redundant array 3519A, and coupled to associated redundant row registers 2812 and redundant row tag registers 2813.

Optionally, rows are organized into sectors, and sectors are organized into sector groups. In one example, respective sectors contain two rows, and respective sector groups contains four sectors. Optionally, row registers 2802 and redundant row registers 2812 can respectively store 8 bits, 4 bits, 16 bits, or any other number of bits. Optionally, row tag registers 2803 and redundant row tag registers 2813 can respectively store 1 bit which operates as a tag bit for its associated row.

At the beginning of a neural read operation, row registers 2802-0 through 2802-n and redundant row registers 2812-0 through 2812-m are loaded with digital input bits DINx (where x is the number of bits in DIN, such as 128 bits), where the digital input bits may be from a raw input data (e.g., image) or from an output of a previous network layer, to be applied to that particular row during the neural read operation. ENRR is an enable signal to enable loading of row registers. The clock signal, CLK, is used to load the digital input bits DINx into the respective row registers 2802 and redundant row registers 2812, when enabled. In one example, x=128 and row registers 2802 and redundant row registers 2812 respectively store 8 bits, in which case 16 rows registers 2802 and redundant row registers 2812 can be loaded per clock cycle. In an instance where a particular row of VMM array 2701 is known to be bad, its associated redundant row register will be loaded instead of, or in addition to, the row register for the bad row. This register loading operation is described in greater detail with reference to FIG. 32, below.

With reference again to FIG. 28, at the beginning of a neural read operation, or prior to a neural read operation, row tag registers 2803-0 and 2803-n are respectively loaded with a first value (e.g., a "1") if the associated row is a good row and is enabled (which will be indicated by DIN received for that row tag bit="1") and with a second value (e.g., a "0") if the associated row is a bad row (which will be indicated by DIN received for that row tag bit="0"). Similarly, redundant row tag registers 2813-0 through 2813-*m* are respectively loaded with a third value (e.g., a "1") if the redundant row is to be used and is enabled (which will be indicated by DIN for that redundant row tag bit="1") and with a fourth value (e.g., a "0") if the redundant row is not be to used (which will be indicated by DIN for that redundant row tag bit="0"). The DINx, ENRT (which is an enable signal to enable loading of row tag registers), and CLK signals are used for this tag register load operation in conjunction with tag bit loading circuit 3000 described in greater detail with reference to FIG. 30, below. In the example where x=128, 128 row tag registers 2803 and redundant row tag registers 2813 are loaded per clock cycle. This row tag register loading example is described in greater detail with reference to FIG. 33, below.

Alternatively, instead of loading all row tag registers 2803 and all redundant row tag registers 2813 with tag bit values, the row address, XA[k:0], is used to access one bad row or one redundant row at a time and to load the associated row tag register 2803 directly with a second value (e.g., "0") to indicate a bad row and to load the associated redundant row tag register 2813 with a third value (e.g., "1") to indicate the redundant row is to be used.

With reference again to FIG. 28, after row registers 2802, redundant row registers 2812, row tag registers 2803, and redundant row tag registers 2813 are loaded, a neural read operation can be performed. In a neural read operation, an address (XA[k:0]) is not required because all rows in a VMM array will be read at one time, and the read operation for those rows instead can be enabled by the global enable signal ENRDG. All row registers 2802 that receive the enable signal ENRDG will output their stored activation data to their associated digital-to-analog converter 2804. If the tag bit in the row tag register 2803 indicates a good row (e.g., tag bit="1"), then the row tag register 2803 will assert an output enable signal (e.g., output="1") to the associated digital-to-analog converter 2804. If the tag bit in the row tag register 2803 indicates a bad row (e.g., tag bit="0"), then the row tag register 2803 will deassert an output enable signal (e.g., output="0") to the associated digital-to-analog converter 2804. The digital-to-analog converters 2804 that receive an asserted output enable signal from a row tag register 2803 then will convert the received digital values received from associated row registers 2802 into analog voltages, CG0 through CGn, that are applied to respective control gate lines in VMM array 2701.

In another example, the global enable signal ENRDG enables the DACs to convert the inputs from the row registers and the tag bits into analog voltages CGx that are applied to respective control gates in VMM array 2701. In this case, the row registers and the tag bits are enabled beforehand. In another example, the global enable signal ENRDG enables the analog output CGx of the DACs through an output mux (not shown) at the DAC output to be applied to respective control gates in VMM array 2701. In this case, the row registers, the tag bits, and DACs are enabled beforehand.

Figure 29:
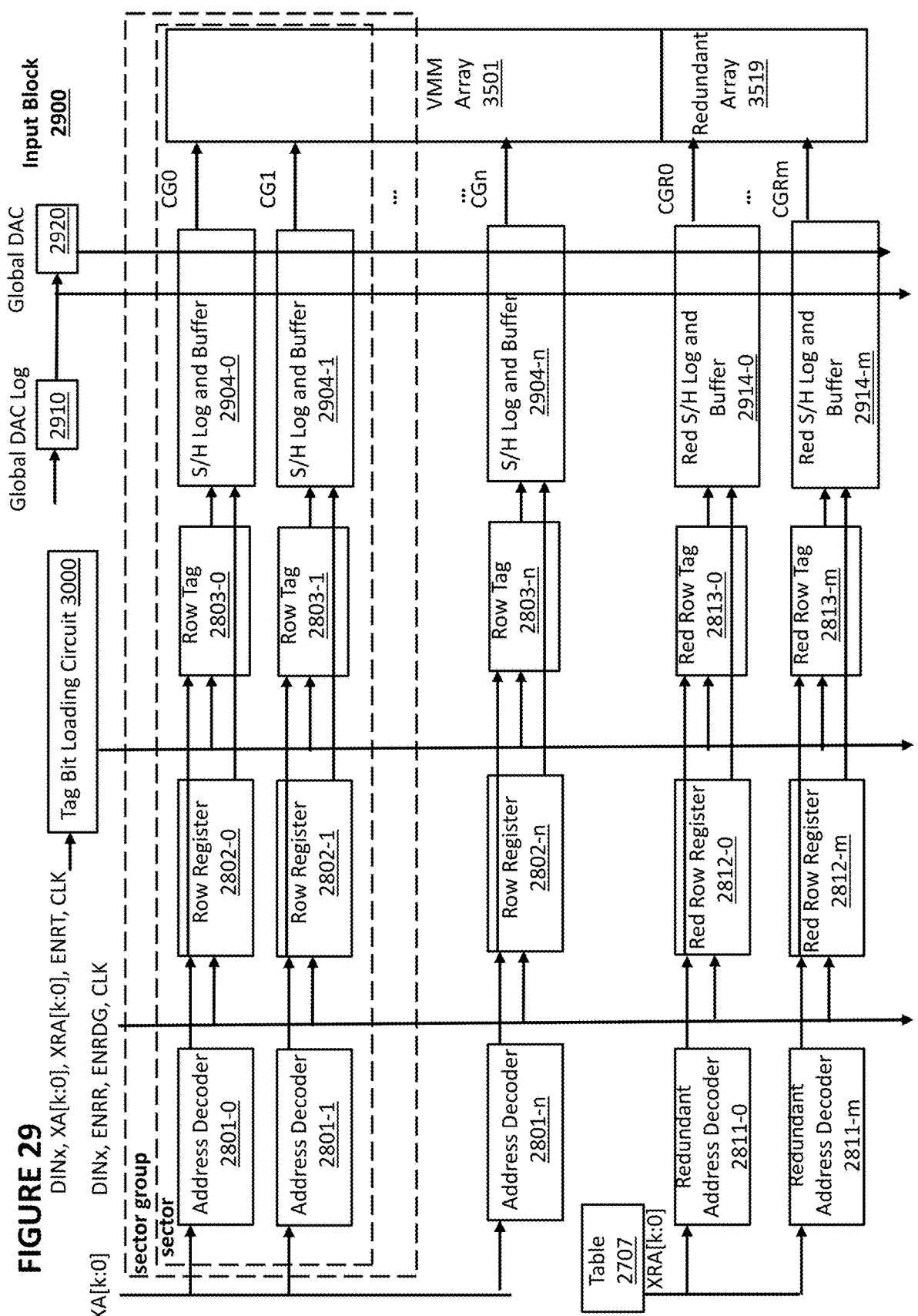
FIG. 29 depicts an example input block for implementing row redundancy in a VMM array.

Similarly, during the neural read operation, a redundant address (XRA[k:0]) is not required, and the read operation for redundant rows instead can be enabled by the global enable signal ENRDG. All redundant row registers 2812 that receive the enable signal ENRDG will output their stored activation data to their associated redundant digital-to-analog converters 2814. If the tag bit in a row tag register 2813 indicates the redundant row is to be used (e.g., redundant tag bit="1"), then the redundant row tag register 2813 will assert an output enable signal (e.g., output="1") to the associated redundant digital-to-analog converter 2814. If the tag bit in the redundant row tag register 2813 indicates the redundant row is not to be used (e.g., redundant tag bit="0"), then the redundant row tag register 2814 will deassert an output enable signal (e.g., output="0") to the associated redundant digital-to-analog converter 2814. The redundant digital-to-analog converters 2814 that receive an asserted output enable signal from a redundant row tag register 2813 will convert the digital values received from associated redundant row registers 2812 into analog voltages, CGR0 through CGRm, that are applied to respective control gate lines in redundant array 2719A. Similarly as for regular rows, alternatively, the global enable signal ENRDG enables the DAC, or the output of the DAC as for regular rows, The end result is that all good rows, but not the bad rows, in VMM array 2701 will receive input values and redundant rows in redundant array 2719 that are associated with bad rows in VMM array 2701 will receive input values, and the desired output currents will be received from VMM array 2701 and redundant array 3519A (such as in the form of current from bit lines of VMM array 2701 and redundant array 3519A) as the output of the neural read operation. The row tag registers and redundant row tag registers are used to identify rows and redundant rows to be read during a neural read operation FIG. 29 depicts input block 2900 which is similar to that of the input block 2800 in FIG. 28 with the DACs 2804 and redundant DACs 2814 replaced by respective sample and hold (S/H) logic and buffers 2904 and redundant sample and hold logic and buffers 2914 as well as global digital-to-analog converter (DAC) 2920 and sample and hold (S/H) and DAC logic circuit 2910. During a neural read operation, the activation data from row registers 2802 and redundant row registers 2812 is provided to respective S/H logic and buffers 2804. The S/H and DAC logic 2910 will control the global DAC 2920 to provide the global DAC analog voltage to the local S/H logic and buffers 2904. The S/H and DAC logic 2920 together with logic inside the logic S/H logic and buffers 2904 will sample the corresponding global DAC analog voltage into the local buffers inside the logic S/H and logic buffers. Further details regarding implementations of sample and hold buffers, a global digital-to-analog converter, and S/H and DAC logic circuit are contained in U.S. patent application Ser. No. 18/077,686, filed on Dec. 8, 2022, and titled "Input Circuit for Artificial Neural Network Array," which is incorporated by reference herein. Row tag registers 2803 and redundant row tag registers 2813 generate asserted or deasserted output enable signals in the same manner described above for FIG. 28. Sample and hold buffers 2904 and redundant sample and hold buffers that receive an asserted output enable signal from a row tag register 2803 or a redundant row tag register 2813 will apply their held analog voltages, CGR0 through CGRm, to respective control gate lines in redundant array 2719A.

FIG. 30 depicts row tag register loading circuit 3000, which comprises address comparators 3001 and 3011 and switches 3002, 3003, 3012, and 3013, and is used to load tag bits and redundant tag bits received as DIN during a load operation into row tag registers 2803 and redundant row tag registers 2813.

Address comparator 3001 and switches 3002 and 3003 are used to load data into row tag registers 2803. Address comparator 3001 compares a received row address XA [k:0] with known bad addresses XA'[k:0] stored in table 2607. If there is a match, switch 3003 is closed and switch 3002 is opened, and DIN_INT, which is the input to the respective tag register, is tied to ground (i.e., DIN_INT="0"). This will cause the tag bit that is loaded into the tag bit register to be "0". If there is no match, then switch 3003 is opened and switch 3002 is closed, and DIN_INT is the same value as the received DIN value, which will be "1" by default. As a result of this operation, the stored tag bit will be "1" (a first value) if the row is a good row and will be "0" (a second value) if the row is a bad row.

Address comparator 3011 and switches 3012 and 3013 are used to program redundant tag bit registers 2813. Address comparator 3011 compares a received row address XA [k:0] with known bad addresses XA'[k:0] stored in table 2607. If there is a match, switch 3013 is closed and switch 3012 is opened, and DIN_INT will have the same value as the received DIN value, which will be "1" by default. This will cause the redundant tag bit loaded into redundant tag bit register to be "1." If there is no match, switch 3013 is opened and switch 3012 is closed, which will cause DIN_INT to be tied to ground (i.e., DIN_INT="0"). This will cause the redundant tag bit that is loaded into the redundant tag bit register to be "0". As a result of this operation, the stored redundant tag bit will be "1" (a first value) if the redundant row is to be used and will be "0" (a second value) if the redundant row is not to be used.

FIG. 31 depicts row register loading circuit 3100, which comprises address comparators 3101 and 3111 and switches 3102, 3103, 3112, and 3113, and is used to row registers 2802 and redundant row registers 2812 with activation data received as DIN during a load operation.

Address comparator 3101 and switches 3102 and 3103 are used to load data into row registers 2802. Address comparator 3101 compares a received row address XA [k:0] with known bad addresses XA'[k:0] stored in table 2607. If there is a match, switch 3103 is closed and switch 3102 is opened, and DIN_INT, which is the input to the respective row register 2802, is tied to ground (i.e., DIN_INT[7:0]="0"). This will cause bits loaded into the respective row register 2802 to be all "0s". If there is no match, then switch 3103 is opened and switch 3102 is closed, and DIN_INT[7:0] is the same values as the received DIN[7:0] value, meaning the received activation data will be loaded into row register 2802. As a result of this operation, activation data will be stored if the row is a good row and all 0's will be stored if the row is a bad row.

Address comparator 3111 and switches 3112 and 3113 are used to program redundant row registers 2812. Address comparator 3111 compares a received row address XA [k:0] with known bad addresses XA'[k:0] stored in table 2607. If there is a match, switch 3113 is closed and switch 3112 is opened, and DIN_INT[7:0] will have the same value as the received DIN[7:0]value, meaning the received activation data will be loaded into redundant row register 2812. If there is no match, switch 3113 is opened and switch 3112 is closed, which will cause DIN_INT[7:0] to be tied to ground (DIN_INT[7:0]="0"). This will cause bits loaded into the respective redundant row register 2812 to be all "0s". As a result of this operation, activation data will be stored if the redundant row is to be used and all 0's will be stored if the redundant row is not to be used.

FIG. 32 depicts row register load operation 3200, which is used to load data for a row group i into row registers 2802 and redundant row registers 2812 described previously with reference to FIGS. 28, 30, and 31.

In operation 3201, input block 2800 receives a row group address for row group i (which comprises a first set of bits contained in address XA[k:0] to indicate a particular row group), row addresses for rows within row group i (which comprises a second set of bits contained in address XA[k:0] to identify specific rows within the row group), and data DIN[127:0] to be loaded into the row registers corresponding to those row addresses within row group i.

In operation 3202, the system determines if the row group address matches any stored row group addresses containing bad rows as indicated in table 2607. If no, then row group i and its rows do not contain any bad rows and the load operation proceeds to operation 3204. If yes, then row group i does contain at least one bad row and the load operation proceeds to operation 3203.

In operation 3203, the system identifies those redundant row registers that are associated with row addresses for bad rows in row group i and it loads the bits in DIN[127:0] corresponding to the associated bad row address. For example, if table 2607 indicates that row address X1 in row group i is a bad row, table 2607 will further identify a redundant row to use in place of row X1. Thereafter, the data in DIN[127:0] for bad row X1 will be loaded into the associated redundant row register.

In operation 3204, the system loads DIN[127:0] into row registers in row group i. This includes loading data into the bad row X1. The data in bad row X1 will not actually be used in subsequent read or neural read operations because its associated row tag bit will indicate that it is a bad row. Alternatively, the system instead could load no data, or data of a known pattern such as all "0s," into any bad rows such as row X1.

FIG. 33 depicts row tag register load operation 3300, which is used to load data into row tag registers 2803 and redundant row tag registers 2813 described previously with reference to FIGS. 28, 36B, and 37A.

In operation 3301, the system receives a row group address for row group i (which comprises a first set of bits contained in address XA[k:0] to indicate a particular row group), row addresses for rows within row group i (which comprises a second set of bits contained in address XA[k:0] to identify specific rows within the row group), and data DIN[127:0] to be loaded into the row tag registers corresponding to those row addresses within row group i.

In operation 3302, the system determines if the row group address matches any stored row group addresses containing bad rows as indicated in table 2607. If no, then row group I does not contain any bad rows and the load operation proceeds to operation 3303. If yes, then row group I does contain at least one bad row and the load operation proceeds to operation 3304.

In operation 3303, the system loads DIN[127:0] into row tag registers in row group i.

In operation 3304, the system identifies those redundant row tag registers that are associated with bad rows in row group i by consulting table 2607 and loads the bits in DIN[127:0] (which might be all "1s") into the redundant row tag register corresponding to the associated row address. For example, if table 2607 indicates that row address X1 in group i is a bad row, table 2607 will further identify a redundant row to use in place of row X1. The row tag data in the row tag data register associated with the bad row X1 will then be loaded with a "0" to indicate that the row is a bad row. The redundant row tag data in the associated redundant row tag data register will be loaded with a "1" to indicate that the redundant rows is to be used. The row tag data in DIN[127:0] associated with row address X1 will be stored in the redundant row tag register associated with redundant row address R1.

In operation 3305, the system loads DIN[127:0] into row tag registers in row group i for rows that are not bad rows and associated with redundant rows and it loads a "0" into row tag registers for bad rows that are associated with redundant rows.

In this manner, the row tag registers are loaded with bits to indicate which rows are good rows and which rows are bad rows, and the redundant row tag registers are loaded with bits to indicate which redundant rows are to be used during a read or neural read operation and which redundant rows are to not be used during a read or neural read operation.

FIG. 34 depicts neural read method 3400. Neural read method 3400 comprises operations 3401, 3402, and 3403.

Operation 3401 comprises converting data stored in row registers, based on values stored in row tag registers, into a first set of analog voltages and applying the first set of analog voltages to respective rows of non-volatile memory cells in an array of non-volatile memory cells. Under one option, the converting data stored in row registers comprises receiving, by digital-to-analog converters, digital data from the row tag registers and generating the first set of analog voltages. Under another option, the converting data stored in row registers comprises sampling and holding the first set of analog voltages, by sample and hold buffers, in response to digital data from the row tag registers Operation 3402 comprises converting data stored in redundant row registers, based on values stored in redundant row tag registers, into a second set of analog voltages and applying the second set of analog voltages to respective rows of non-volatile memory cells in a redundant array of non-volatile memory cells. Under one option, the converting data stored in redundant row registers comprises receiving, by redundant digital-to-analog converters, digital data from the redundant row tag registers and generating the second set of analog signals. Under another option, the converting data stored in redundant row registers comprises sampling and holding the second set of analog voltages, by sample and hold buffers, in response to digital data from the redundant row tag registers.

Operation 3403 comprises receiving current from the array of non-volatile memory cells and the redundant array of non-volatile memory cells.

The array in method 3400 can comprises an array of non-volatile memory cells. The non-volatile memory cells can comprise stacked-gate flash memory cells (such as of the type shown as memory cell 510 in FIG. 5) or split-gate flash memory cells (such as of the type shown as memory cells 210, 310, and 410 in FIGS. 2-4).

Figure 35:
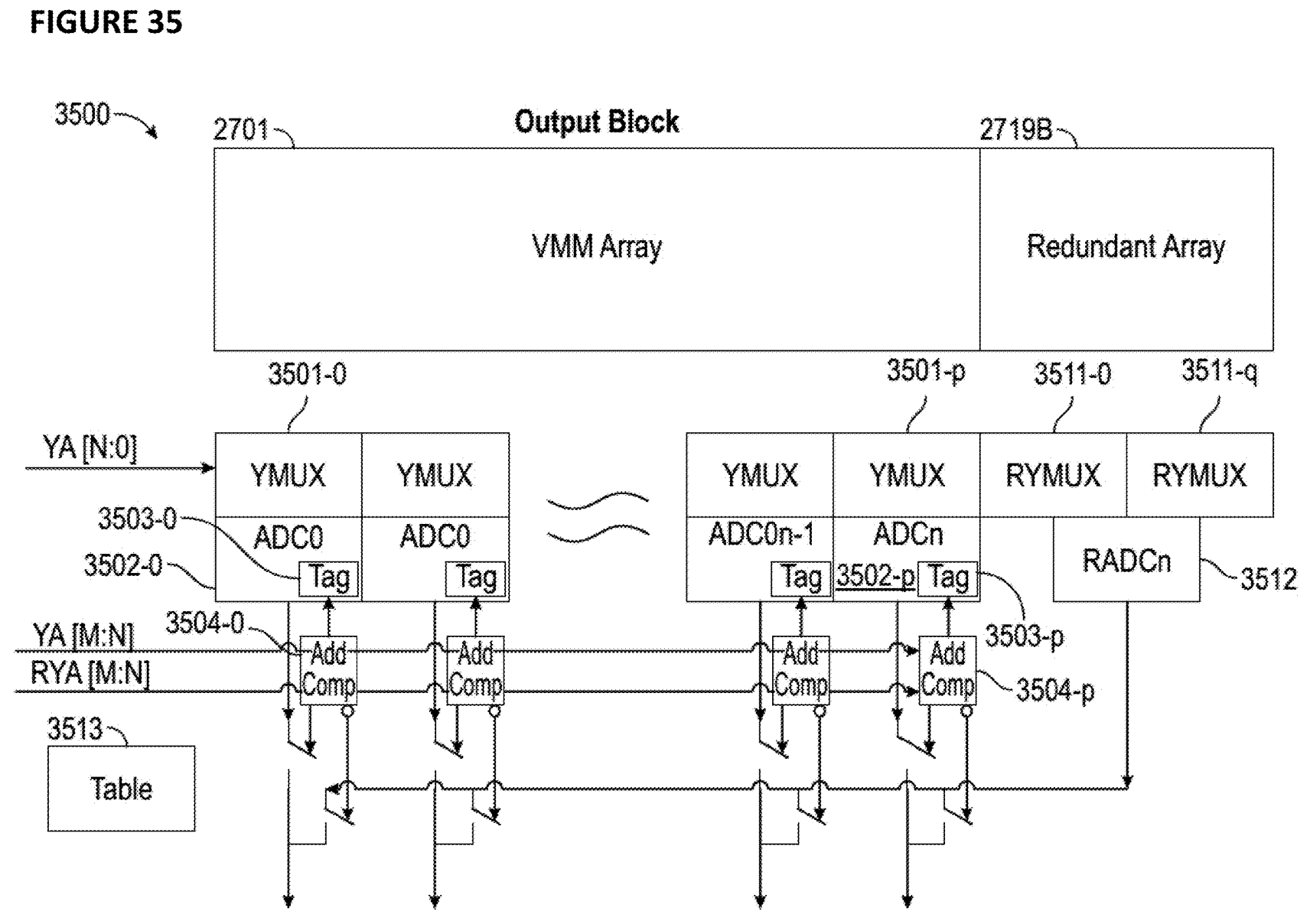

Redundancy also can be implemented on a column basis instead of a row basis. FIG. 35 depicts output block 3500 that implements column redundancy for VMM array 2701 using redundant array 2719B in FIG. 27. Each column in VMM array 2701 is associated with a respective column multiplexor 3501, a respective analog-to-digital converter 3502, a respective address comparator 3504, and switches as shown. Prior to a neural read operation, a set of column addresses known to be bad columns (which can be determined by comparison to addresses in table 3513) are identified, and a tag bit in a column tag register 3503 is set to identify those bad columns. For example, a tag bit of "0" can indicate a bad column and a tag bit of "1" can indicate a good column. Thereafter, during a neural read operation, columns with a tag bit indicating a bad column and are not coupled by a switch to the output. For those columns, the corresponding redundant column in redundant array 2719B is instead read using redundant column multiplexor 3511 and redundant analog-to-digital converter 3512 and the associated switch shown. Thus, the data from good columns, but not the bad columns, in VMM array 2701 will be output and the redundant data in redundant array 2719 associated with the bad columns will be output. The tag bits in column tag registers 3503 are used to indicate the good columns to be used and the bad columns to not be used during a neural read operation. The one or more analog-to-digital converters 3502 convert analog signals from the column multiplexors 3501 into one or more bits and one or more redundant analog-to-digital converters 3512 convert analog signals from the redundant column multiplexors 3511 into one or more bits.

FIG. 36 depicts neural read method 3600 utilizing output block 3400. Method 3600 comprises operations 3601, 3602, and 3603. Operation 3601 comprises setting column tag bits in column tag bit registers associated with columns in an array to a first value or a second value based on the data in a table. Operation 3602 comprises receiving current from columns in an array associated with column tag bits of the first value and converting, by one or more analog-to-digital converters, the current received from the columns in the array into digital data. Operation 3603 comprises receiving current from redundant columns in a redundant array when the redundant columns are associated with columns in the array associated with column tag bits of the second value and converting, by one or more redundant analog-to-digital converters, the current received from the redundant columns in the redundant array into digital data.

The array in method 3600 can comprises an array of non-volatile memory cells. The non-volatile memory cells can comprise stacked-gate flash memory cells (such as of the type shown as memory cell 510 in FIG. 5) or split-gate flash memory cells (such as of the type shown as memory cells 210, 310, and 410 in FIGS. 2-4).

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A system comprising:
    an array of non-volatile memory cells arranged into rows and columns;
    a redundant array of non-volatile memory cells arranged into rows and columns; and an input block coupled to respective rows in the array and respective rows in the redundant array and comprising for each of the respective rows in the array:

a row register configured to store and output a digital value;

a row tag register configured to store a value and output an enable signal in response to the value;

a digital-to-analog converter configured to receive the digital value from the row register and to apply an analog signal to a row of the array if the enable signal from the row tag register is a first value and to not apply an analog signal to the row of the array if the enable signal from the row tag register is a second value;

wherein the input block comprises for each of the rows in the redundant array:

a redundant row register configured to store and output a digital value;

a redundant row tag register configured to store a value and output an enable signal in response to the value; and a redundant digital-to-analog converter configured to receive the digital value from the redundant row register and to apply an analog signal to a row of the redundant array if the enable signal from the redundant row tag register is a third value and to not apply an analog signal to the row of the redundant array if the enable signal from the row tag register is a fourth value.

2. The system of claim 1, wherein the input block comprises for each row an address decoder coupled to the row register.

3. The system of claim 1, wherein the non-volatile memory cells in the array of non-volatile memory cells and the non-volatile memory cells in the redundant array of non-volatile memory cells are split-gate flash memory cells.

4. The system of claim 1, wherein the non-volatile memory cells in the array of non-volatile memory cells and the non-volatile memory cells in the redundant array of non-volatile memory cells are stacked-gate flash memory cells.

* * * * *